United States Patent
More

(10) Patent No.: US 12,002,717 B2
(45) Date of Patent: *Jun. 4, 2024

(54) SEMICONDUCTOR DEVICE AND METHOD

(71) Applicant: Taiwan Semiconductor Manufacturing Co., Ltd., Hsinchu (TW)

(72) Inventor: Shahaji B. More, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/068,075

(22) Filed: Dec. 19, 2022

(65) Prior Publication Data

US 2023/0123868 A1 Apr. 20, 2023

Related U.S. Application Data

(63) Continuation of application No. 17/155,690, filed on Jan. 22, 2021, now Pat. No. 11,532,520.

(Continued)

(51) Int. Cl.
*H01L 21/8238* (2006.01)
*H01L 27/092* (2006.01)
(Continued)

(52) U.S. Cl.
CPC ........ *H01L 21/823814* (2013.01); *H01L 21/823821* (2013.01); *H01L 21/823864* (2013.01);

(Continued)

(58) Field of Classification Search
CPC ..... H01L 21/823814; H01L 21/823821; H01L 21/823864; H01L 21/823878;
(Continued)

(56) References Cited

U.S. PATENT DOCUMENTS 10,026,662 B2 7/2018 Sung et al.
10,340,384 B2 7/2019 Lin et al.
(Continued)

FOREIGN PATENT DOCUMENTS

CN 106684149 A 5/2017
CN 107527910 A 12/2017
(Continued)

*Primary Examiner* — Karen Kusumakar
*Assistant Examiner* — Adam S Bowen
(74) *Attorney, Agent, or Firm* — Slater Matsil, LLP

(57) ABSTRACT

An embodiment device includes: first fins protruding from an isolation region; second fins protruding from the isolation region; a first fin spacer on a first sidewall of one of the first fins, the first fin spacer disposed on the isolation region, the first fin spacer having a first spacer height; a second fin spacer on a second sidewall of one of the second fins, the second fin spacer disposed on the isolation region, the second fin spacer having a second spacer height, the first spacer height greater than the second spacer height; a first epitaxial source/drain region on the first fin spacer and in the first fins, the first epitaxial source/drain region having a first width; and a second epitaxial source/drain region on the second fin spacer and in the second fins, the second epitaxial source/drain region having a second width, the first width greater than the second width.

20 Claims, 23 Drawing Sheets

Related U.S. Application Data

(60) Provisional application No. 63/082,526, filed on Sep. 24, 2020, provisional application No. 63/065,552, filed on Aug. 14, 2020.

(51) Int. Cl.
  *H01L 29/06* (2006.01)
  *H01L 29/08* (2006.01)
  *H01L 29/78* (2006.01)

(52) U.S. Cl.
  CPC .. *H01L 21/823878* (2013.01); *H01L 27/0924* (2013.01); *H01L 29/0653* (2013.01); *H01L 29/0847* (2013.01); *H01L 29/7848* (2013.01)

(58) Field of Classification Search
  CPC ............ H01L 27/0924; H01L 29/0653; H01L 29/0847; H01L 29/7848; H01L 21/823418; H01L 21/823431; H01L 29/0673; H01L 29/165; H01L 29/66545; H01L 29/6656; H01L 29/775; H10B 10/18
  See application file for complete search history.

(56) References Cited

U.S. PATENT DOCUMENTS

| | | |
|---|---|---|
| 10,720,530 B2 | 7/2020 | Ma et al. |
| 2014/0091360 A1 | 4/2014 | Pillarisetty et al. |
| 2015/0255604 A1 | 9/2015 | Yang |
| 2016/0005868 A1 | 1/2016 | Wei et al. |
| 2017/0047411 A1 | 2/2017 | Cheng et al. |
| 2017/0365522 A1 | 12/2017 | Jeong et al. |
| 2018/0158930 A1 | 6/2018 | Liao et al. |
| 2018/0182756 A1* | 6/2018 | Lee ............... H01L 29/0649 |
| 2019/0006363 A1 | 1/2019 | Lin et al. |
| 2019/0393347 A1 | 12/2019 | Kim et al. |

FOREIGN PATENT DOCUMENTS

| | | |
|---|---|---|
| CN | 108242425 A | 7/2018 |
| CN | 110010470 A | 7/2019 |
| CN | 110620150 A | 12/2019 |
| CN | 110957221 A | 4/2020 |
| TW | 201626441 A | 7/2016 |

* cited by examiner

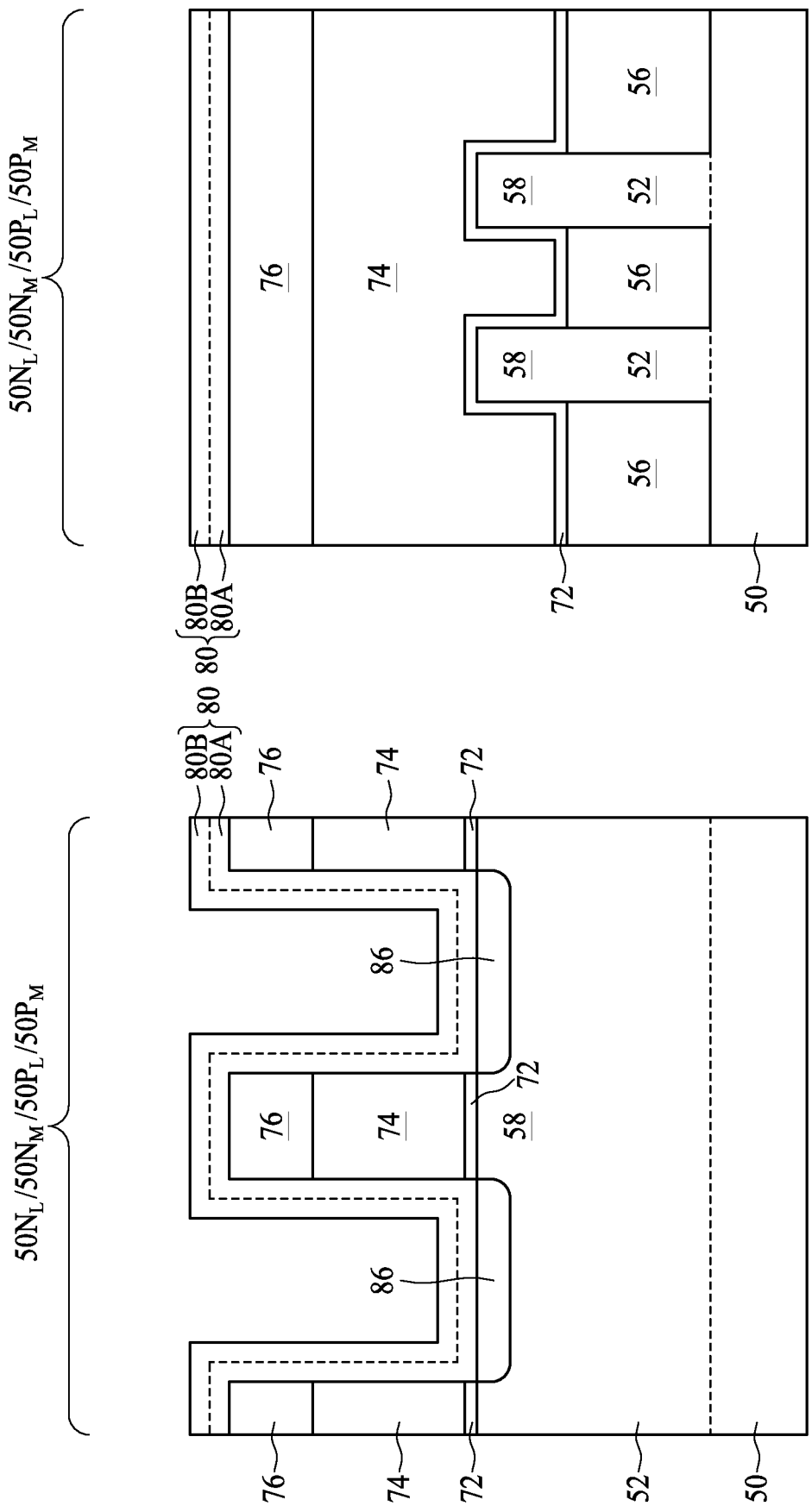

SEMICONDUCTOR DEVICE AND METHOD

PRIORITY CLAIM AND CROSS-REFERENCE

This application is a continuation of U.S. patent application Ser. No. 17/155,690, filed on Jan. 22, 2021, entitled "Semiconductor Device and Method," which claims the benefit of U.S. Provisional Application No. 63/082,526, filed on Sep. 24, 2020, and U.S. Provisional Application No. 63/065,552, filed on Aug. 14, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 17B are various views of intermediate stages in the manufacturing of FinFETs, in accordance with some embodiments.

DETAILED DESCRIPTION

Figure 1:
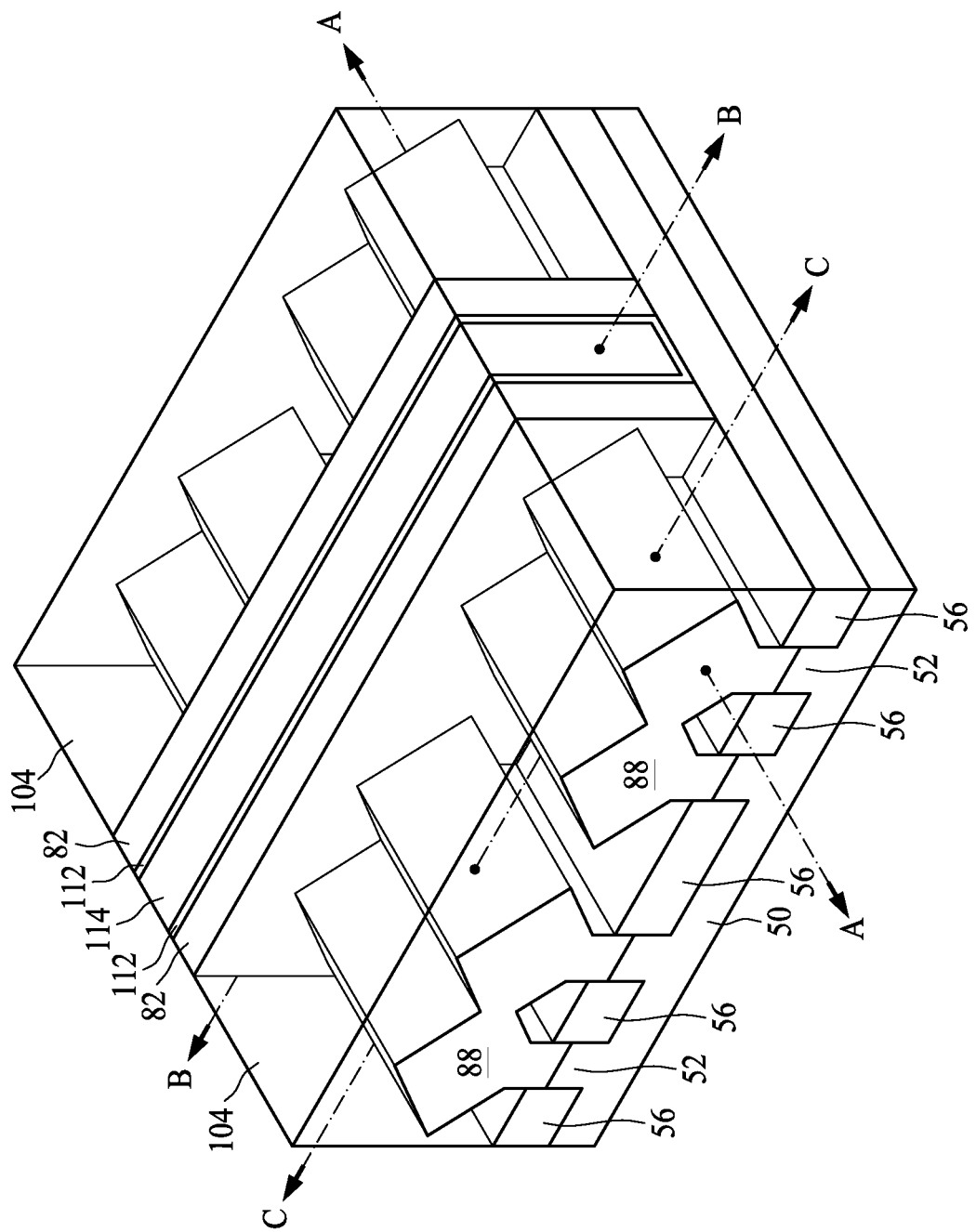
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, fin spacers of different heights are formed adjacent to fins in different regions of a substrate, and source/drain recesses of different depths are formed in fins in different regions of the substrate. Epitaxial source/drain regions are grown in the source/drain recesses. Controlling the heights of the fin spacers and the depths of the source/drain recesses allows the widths of the epitaxial source/drain regions to be more finely controlled. Merging of the epitaxial source/drain regions may be promoted and avoided in the various regions as desired.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically connected or coupled in a manner to operate as, for example, one transistor or multiple transistors, such as two transistors.

The FinFETs include fins 52 extending from a substrate 50. Shallow trench isolation (STI) regions 56 are disposed over the substrate 50, and the fins 52 protrude above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fins 52 are illustrated as being a single, continuous material of the substrate 50, the fins 52 and/or the substrate 50 may include a single material or a plurality of materials. In this context, the fins 52 refer to the portions extending between the neighboring STI regions 56.

Gate dielectrics 112 are along sidewalls and over top surfaces of the fins 52, and gate electrodes 114 are over the gate dielectrics 112. Source/drain regions 88 are disposed in opposite sides of the fins 52 with respect to the gate dielectrics 112 and gate electrodes 114. Gate spacers 82 separate the source/drain regions 88 from the gate dielectrics 112 and the gate electrodes 114. An inter-layer dielectric (ILD) 104 is disposed over the source/drain regions 88 and the STI regions 56. In embodiments where multiple transistors are formed, the source/drain regions 88 may be shared between various transistors. In embodiments where one transistor is formed from multiple fins 52, neighboring source/drain regions 88 may be electrically connected, such as through merging the source/drain regions 88 by epitaxial growth, or through coupling the source/drain regions 88 with a same source/drain contact.

FIG. 1 further illustrates several reference cross-sections. Cross-section A-A is along a longitudinal axis of a fin 52 and in a direction of, for example, a current flow between the source/drain regions 88 of the FinFETs. Cross-section B-B is perpendicular to cross-section A-A and is along a longitudinal axis of a gate electrode 114 and in a direction, for example, perpendicular to the direction of current flow between the source/drain regions 88 of the FinFETs. Cross-section C-C is also perpendicular to cross-section A-A and extends through the source/drain regions 88 of the FinFETs. Subsequent figures refer to these reference cross-sections for clarity.

Figure 2:
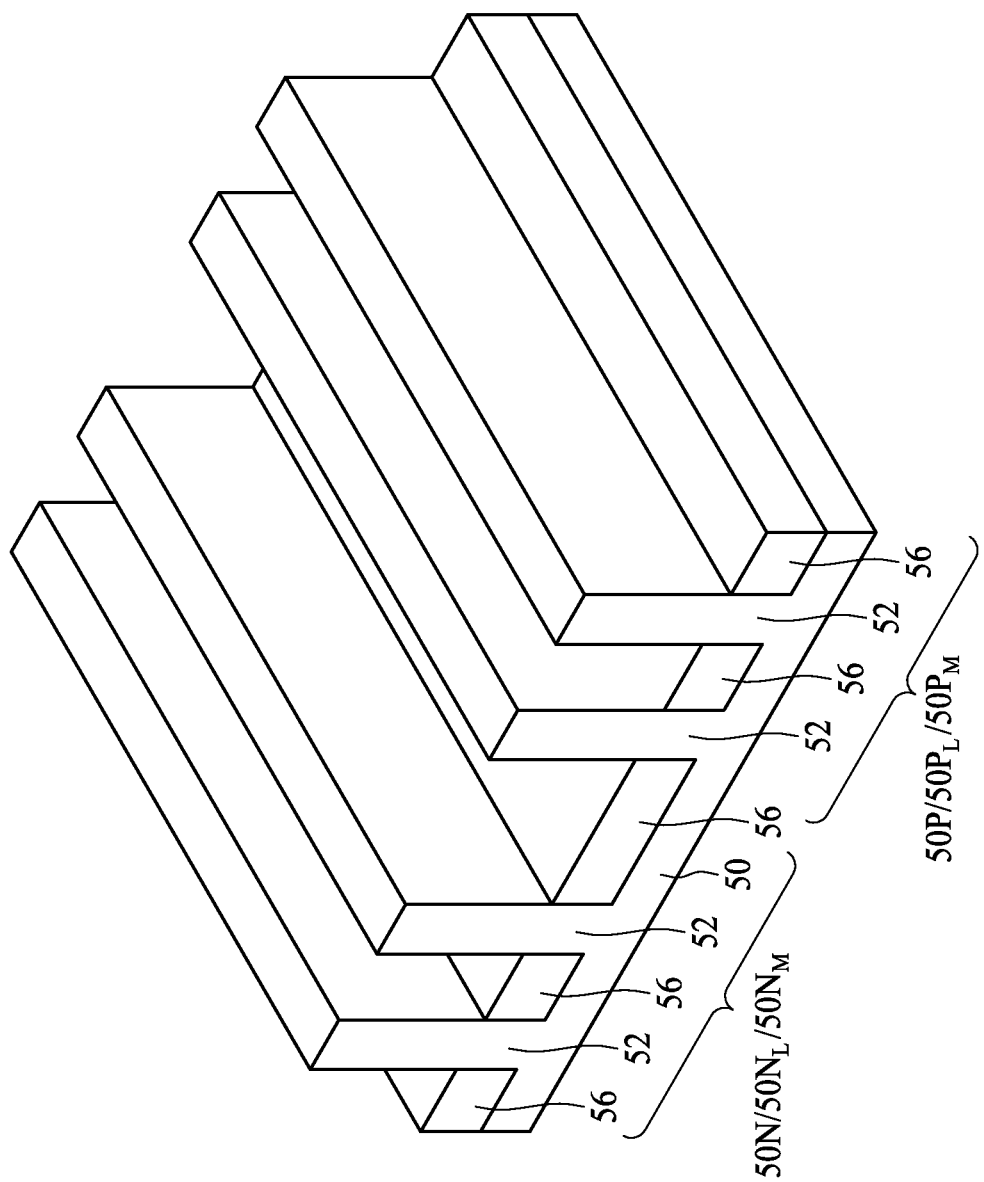
Figure 3:
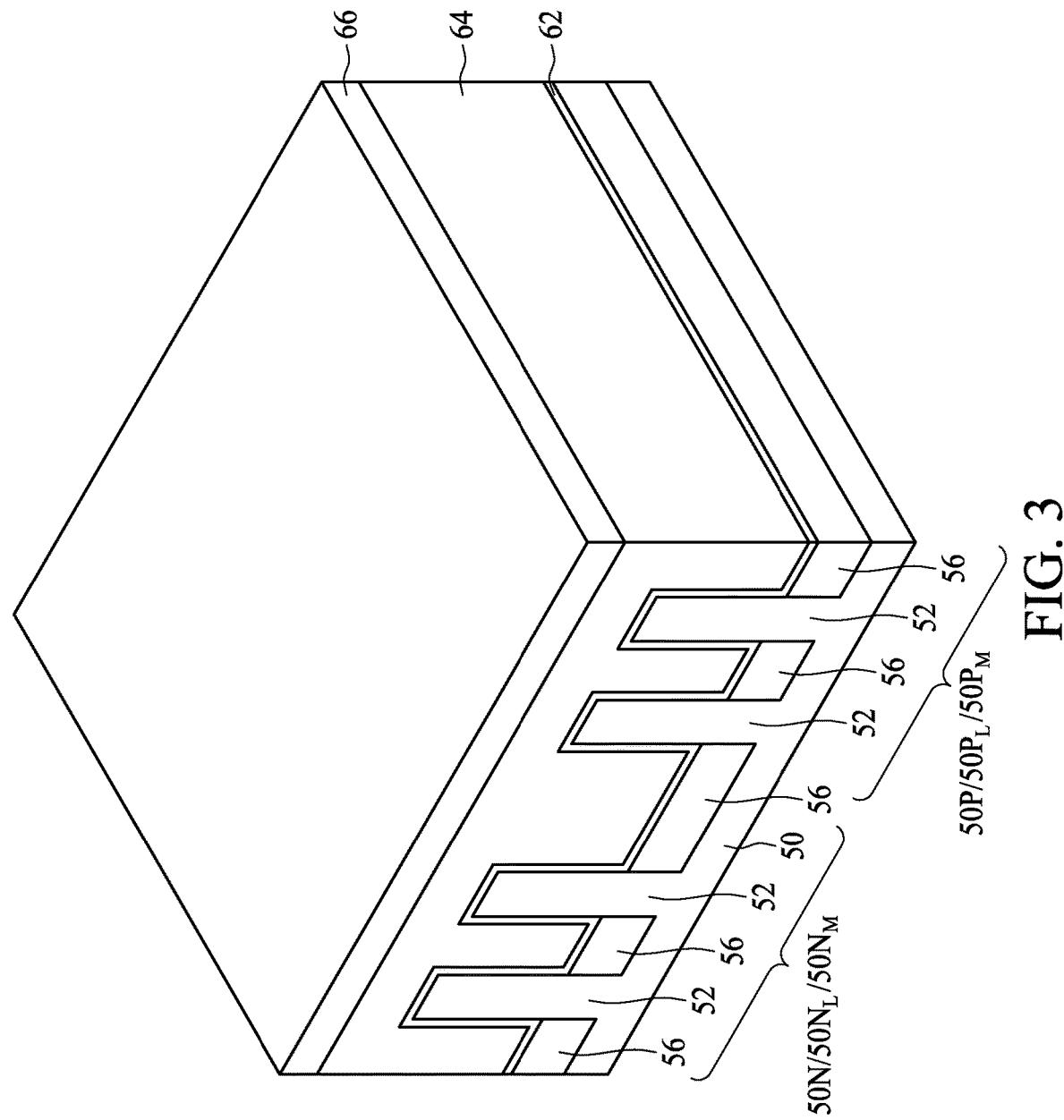
Figure 4:
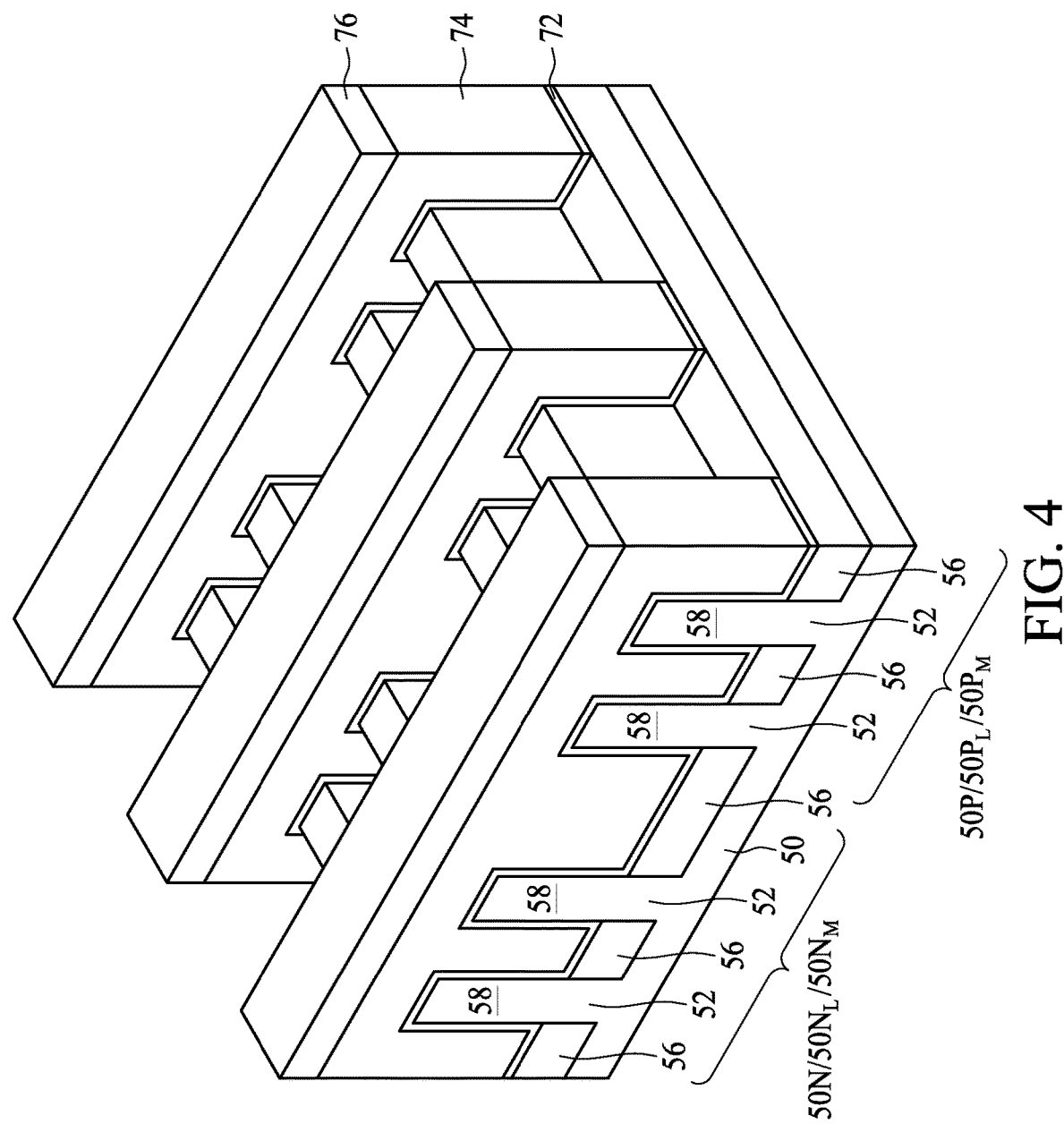

FIGS. 2 through 17B are various views of intermediate stages in the manufacturing of FinFETs, in accordance with some embodiments. FIGS. 2, 3, and 4 are three-dimensional views. FIGS. 5A, 6A, 7A, 12A, 13A, 14A, 15A, 16A, and 17A are cross-sectional views illustrated along reference cross-section A-A in FIG. 1, except three gate structures are shown. FIGS. 5B, 6B, 7B, 12B, 13B, 14B, 15B, 16B, and 17B are cross-sectional views illustrated along reference cross-section B-B in FIG. 1, except only two fins 52 are shown. FIGS. 8A, 8B, 8C, 8D, 9A, 9B, 9C, 9D, 10A, 10B, 10C, 10D, 11A, 11B, 11C, and 11D are cross-sectional views illustrated along reference cross-section C-C in FIG. 1, except only two fins 52 are shown.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or a n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 can be for forming CMOS devices, having a n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P, and any number of device features (e.g., other active devices, doped regions, isolation structures, etc.) may be disposed between the n-type region 50N and the p-type region 50P.

The devices in the regions 50P, 50N will be interconnected to form functional integrated circuits. The integrated circuits can include a combination of logic devices (e.g., NAND gates, NOR gates, etc.) and memories (e.g., dynamic random access memory (DRAM) cells, static random access memory (SRAM) cells, etc.). The regions 50P, 50N include multiple sub-regions. The n-type region 50N includes a n-type logic region $50N_L$ (in which n-type devices for the logic devices will be formed) and a n-type memory region $50N_M$ (in which n-type devices for the memories will be formed). The p-type region 50P includes a p-type logic region $50P_L$ (in which p-type devices for the logic devices will be formed) and a p-type memory region $50P_M$ (in which p-type devices for the memories will be formed). The logic devices are formed by interconnecting the devices in the logic regions $50P_L$, $50N_L$ and the memories are formed by interconnecting the devices in the memory regions $50P_M$, $50N_M$. Thus, the resulting integrated circuits include devices from each of the regions $50P_L$, $50N_L$, $50P_M$, $50N_M$.

Fins 52 are formed extending from the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic. After formations, the fins 52 can each have a width in the range of about 3 nm to about 30 nm, and the fins 52 in a same region 50N/50P can have a pitch in the range of about 20 nm to about 100 nm. The width of the fins 52 is less than the pitch of the fins 52.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 52. In some embodiments, the mask (or other layer) may remain on the fins 52.

STI regions 56 are formed over the substrate 50 and between neighboring fins 52. The STI regions 56 are disposed around lower portions of the fins 52 such that upper portions of the fins 52 protrude from between neighboring STI regions 56. In other words, the upper portions of the fins 52 extend above the top surfaces of the STI regions 56. The STI regions 56 separate the features of adjacent devices.

The STI regions 56 may be formed by any suitable method. For example, an insulation material can be formed over the substrate 50 and between neighboring fins 52. The insulation material may be an oxide, such as silicon oxide, a nitride, the like, or a combination thereof, and may be formed by a chemical vapor deposition (CVD) process, such as a high density plasma CVD (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the fins 52. Although the STI regions 56 are illustrated as a single layer, some embodiments may utilize multiple layers. For example, in some embodiments, a liner (not shown) may first be formed along a surface of the substrate 50 and the fins 52. Thereafter, a fill material, such as those discussed above may be formed over the liner. A removal process is then applied to the insulation material to remove excess insulation material over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material are coplanar (within process variations) after the planarization process is complete. In embodiments in which a mask remains on the fins 52, the planarization process may expose the mask or remove the mask such that top surfaces of the mask or the fins 52, respectively, and the insulation material are coplanar (within process variations) after the planarization process is complete. The insulation material is then recessed to form the STI regions 56. The insulation material is recessed such that upper portions of the fins 52 in the n-type region 50N and in the p-type region 50P protrude from between neighboring portions of the insulation material. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The insulation material may be recessed using an acceptable etching process, such as one that is selective to the material of the insulation material (e.g., etches the material of the insulation material at a faster rate than the material of the fins 52). For example, an oxide removal using, for example, dilute hydrofluoric (dHF) acid may be used.

The process described above is just one example of how the fins 52 and the STI regions 56 may be formed. In some embodiments, the fins 52 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer. In such embodiments, the fins 52 comprise the homoepitaxial structures, and the STI regions 56 comprise the remaining portions of the dielectric layer. Additionally, in some embodiments, heteroepitaxial structures can be used for the fins 52. For example, the fins 52 can be recessed, and a material different from the fins 52 may be epitaxially grown over the recessed material. In such embodiments, the fins 52 comprise the recessed material as well as the epitaxially grown material disposed over the recessed material, and the STI regions 56 comprise the remaining portions of the dielectric layer. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In such embodiments, the fins 52 comprise the heteroepitaxial structures, and the STI regions 56 comprise the remaining portions of the dielectric layer. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., a NMOS region) different from the material in p-type region 50P (e.g., a PMOS region). In various embodiments, upper portions of the fins 52 may be formed of silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further, appropriate wells (not shown) may be formed in the fins 52 and/or the substrate 50. In some embodiments, a p-type well may be formed in the n-type region 50N, and a n-type well may be formed in the p-type region 50P. In some embodiments, p-type well or a n-type well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P. The photoresist can be formed by using a spin-on technique and can be patterned using acceptable photolithography techniques. Once the photoresist is patterned, a n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than about $10^{18}$ cm$^{-3}$, such as in the range of about $10^{16}$ cm$^{-3}$ to about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as in the range of about $10^{16}$ cm$^{-3}$ to about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

In FIG. 3, a dummy dielectric layer 62 is formed on the fins 52. The dummy dielectric layer 62 may be, for example, silicon oxide, silicon nitride, a combination thereof, or the like, and may be deposited or thermally grown according to acceptable techniques. A dummy gate layer 64 is formed over the dummy dielectric layer 62, and a mask layer 66 is formed over the dummy gate layer 64. The dummy gate layer 64 may be deposited over the dummy dielectric layer 62 and then planarized, such as by a CMP. The mask layer 66 may be deposited over the dummy gate layer 64. The dummy gate layer 64 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 64 may be deposited by physical vapor deposition (PVD), CVD, sputter deposition, or other techniques for depositing the selected material. The dummy gate layer 64 may be made of other materials that have a high etching selectivity from the etching of isolation regions, e.g., the STI regions 56 and/or the dummy dielectric layer 62. The mask layer 66 may include one or more layers of, for example, silicon nitride, silicon oxynitride, or the like. In this example, a single dummy gate layer 64 and a single mask layer 66 are formed across the n-type region 50N and the p-type region 50P. In the illustrated embodiment, the dummy dielectric layer 62 covers the STI regions 56, extending over the STI regions 56 and between the dummy gate layer 64 and the STI regions 56. In another embodiment, the dummy dielectric layer 62 covers only the fins 52.

In FIG. 4, the mask layer 66 may be patterned using acceptable photolithography and etching techniques to form masks 76. The pattern of the masks 76 then may be transferred to the dummy gate layer 64 to form dummy gates 74. In some embodiments, the pattern of the masks 76 is also transferred to the dummy dielectric layer 62 by an acceptable etching technique to form dummy dielectrics 72. The dummy gates 74 cover respective channel regions 58 of the fins 52. The pattern of the masks 76 may be used to physically separate each of the dummy gates 74 from adjacent dummy gates 74. The dummy gates 74 may also have a lengthwise direction substantially perpendicular (within process limitations) to the lengthwise direction of the fins 52. The masks 76 may be removed during the patterning of the dummy gate 74, or may be removed in subsequent processing.

FIGS. 5A through 17B illustrate further intermediate stages in the manufacturing of FinFETs. FIGS. 5A, 5B, 6A, 6B, 7A, 7B, 12A, 12B, 13A, 13B, 14A, 14B, 15A, 15B, 16A, 16B, 17A, and 17B may be applicable to both the n-type region 50N (e.g., the n-type logic region $50N_L$ and the n-type memory region $50N_M$) and the p-type region 50P (e.g., the p-type logic region $50P_L$ and the p-type memory region $50P_M$). Differences (if any) in the structures of the n-type region 50N and the p-type region 50P are described in the text accompanying each figure. FIGS. 8A, 9A, 10A, and 11A are applicable to the p-type logic region $50P_L$. FIGS. 8B, 9B, 10B, and 11B are applicable to the p-type memory region $50P_M$. FIGS. 8C, 9C, 10C, and 11C are applicable to the n-type logic region $50N_L$. FIGS. 8D, 9D, 10D, and 11D are applicable to the n-type memory region $50N_M$.

In FIGS. 5A and 5B, one or more spacer layer(s) 80 are formed on exposed surfaces of the dummy gates 74, the masks 76, the fins 52, and/or the STI regions 56. The spacer layer(s) 80 are formed of one or more dielectric materials. Acceptable dielectric materials include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. The dielectric materials may be formed by a conformal deposition process such as chemical vapor deposition (CVD), plasma enhanced chemical vapor deposition (PECVD), atomic layer deposition (ALD), or the like. In the illustrated embodiment, the spacer layer(s) 80 include multiple layers, e.g., a first spacer layer 80A and a second spacer layer 80B. In some embodiments, the first spacer layer 80A and the second spacer layer 80B are each formed of silicon oxycarbonitride (e.g., $SiO_xN_yC_{1-x-y}$, where x and y are in the range of 0 to 1). For example, the first spacer layer 80A can be formed of a similar or a different composition of silicon oxycarbonitride than the second spacer layer 80B.

Further, implants for lightly doped source/drain (LDD) regions 86 may be performed. In the embodiments with different device types, similar to the implants for the wells previously discussed, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The LDD regions 86 may have a concentration of impurities in the range of about $10^{15}$ cm$^{-3}$ to about $10^{19}$ cm$^{-3}$. An anneal may be used to repair implant damage and to activate the implanted impurities. Each channel region 58 is disposed between neighboring pairs of the LDD regions 86.

Figure 6B:
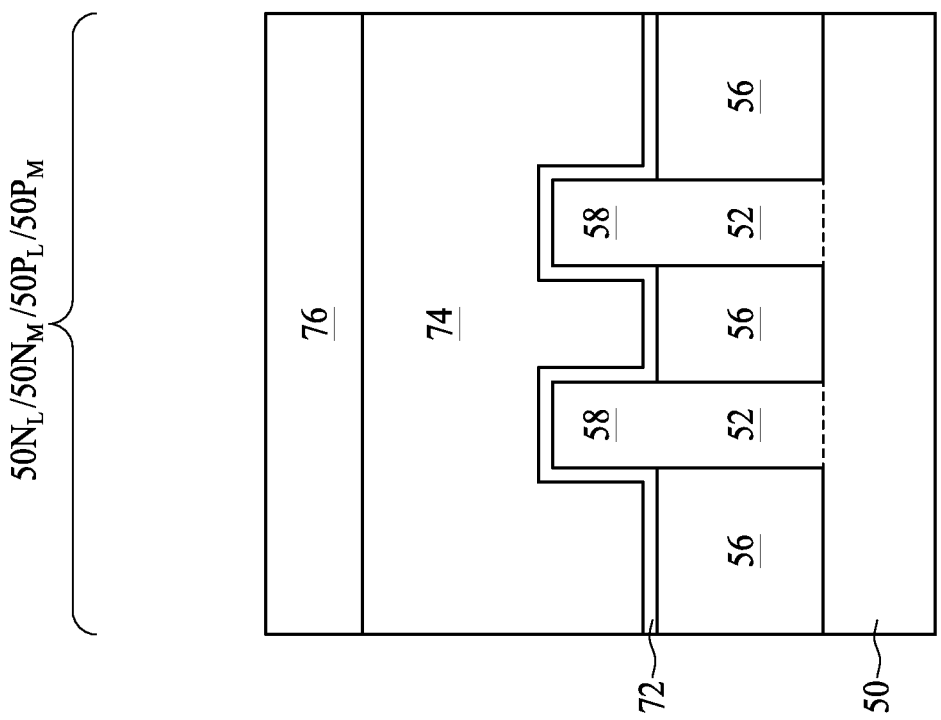
Figure 6A:
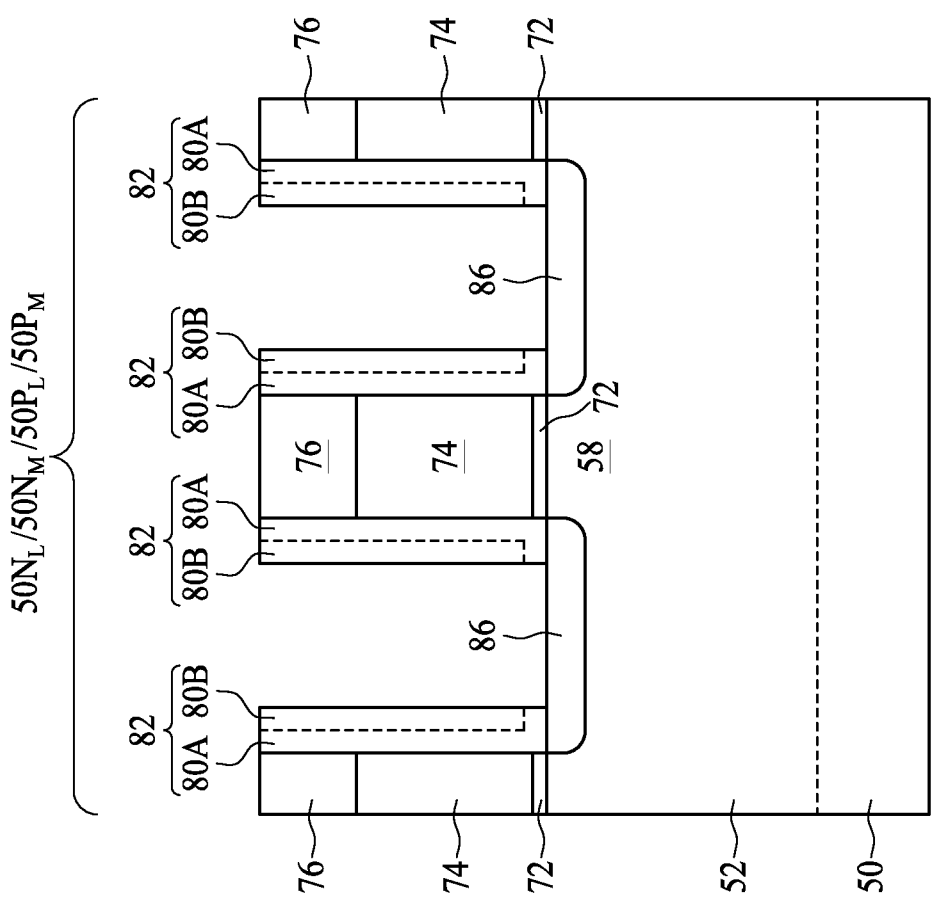

In FIGS. 6A and 6B, the spacer layer(s) 80 are patterned to form gate spacers 82. The gate spacers 82 are formed on the sidewalls of the dummy gates 74 and the top surfaces of the fins 52. An acceptable etch process, such as a dry etch, a wet etch, the like, or a combination thereof, may be performed to pattern the spacer layer(s) 80. The etching may be anisotropic. For example, the spacer layer(s) 80 can be patterned by anisotropically etching the second spacer layer 80B using the first spacer layer 80A as an etch stop layer, and then anisotropically etching the first spacer layer 80A using the patterned second spacer layer 80B as an etching mask. The spacer layer(s) 80, when etched, have portions left on the sidewalls of the dummy gates 74 (thus forming the gate spacers 82). After etching, the gate spacers 82 can have straight sidewalls (as illustrated) or can have curved sidewalls (not illustrated).

Figure 7B:
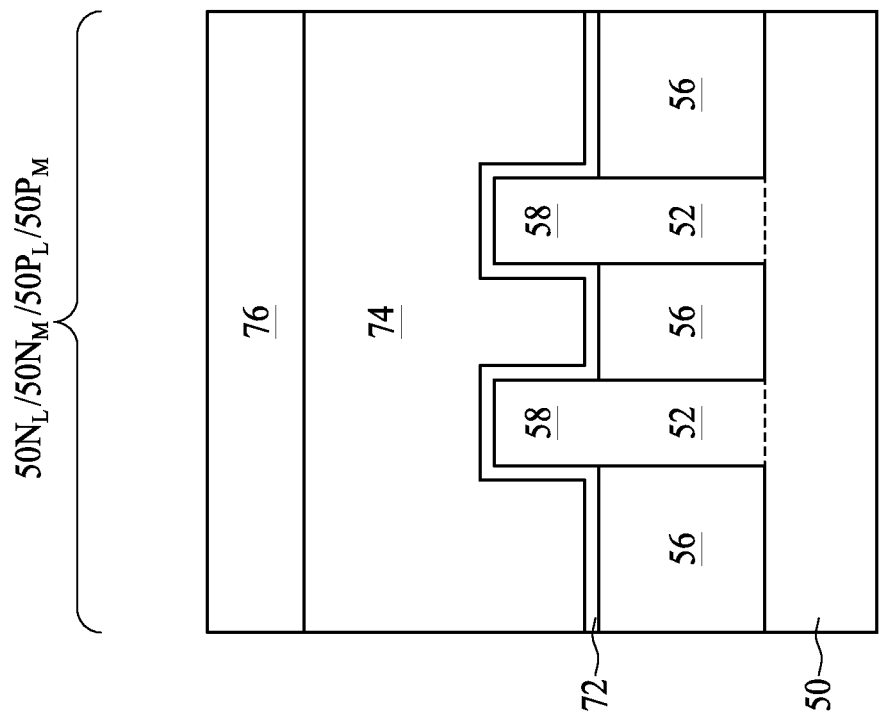
Figure 7A:
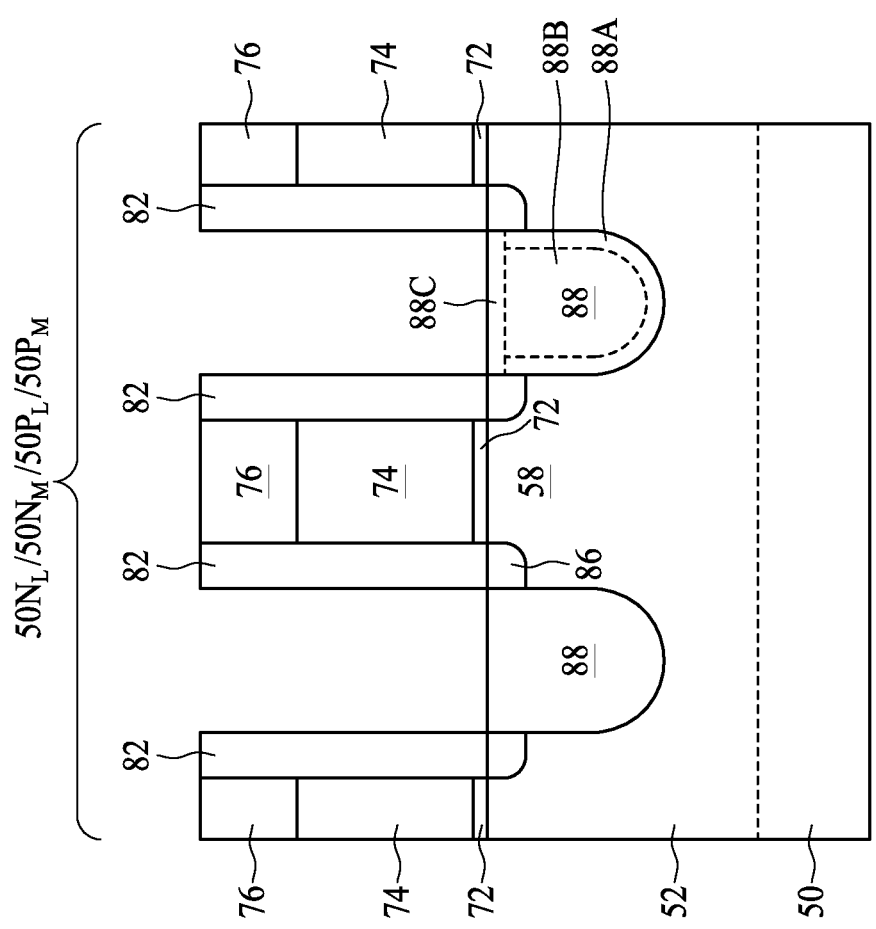
Figure 8B:
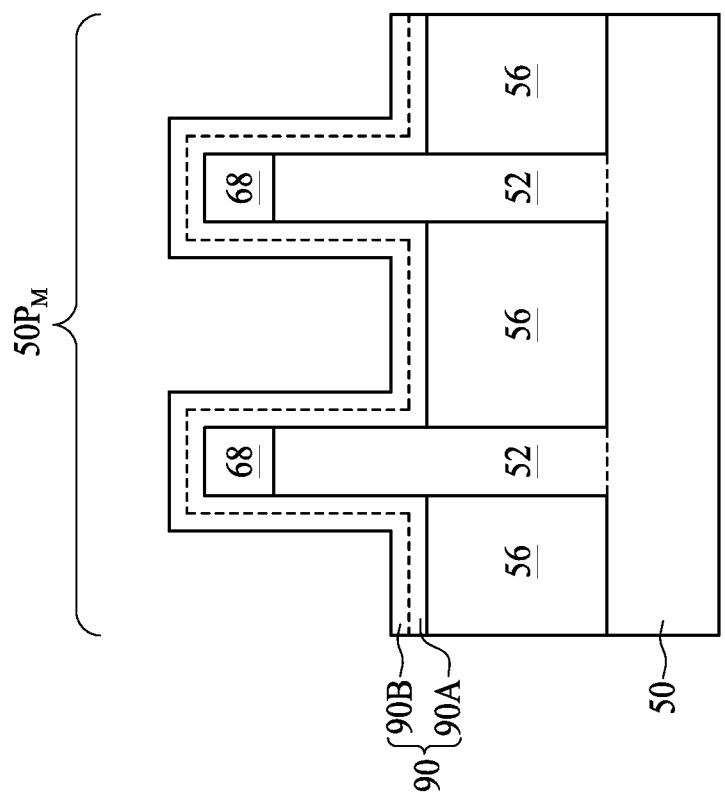
Figure 8A:
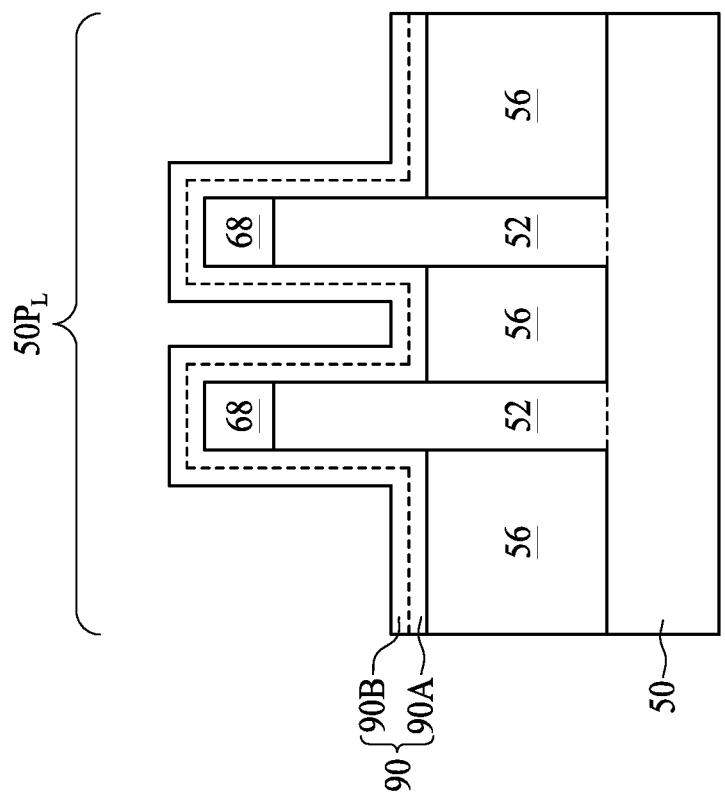
Figure 8C:
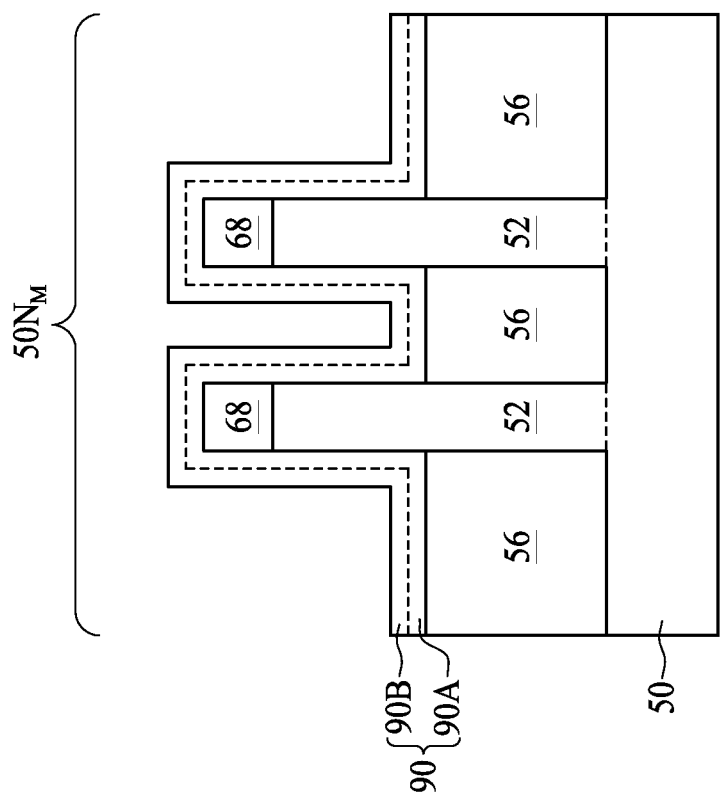
Figure 8D:
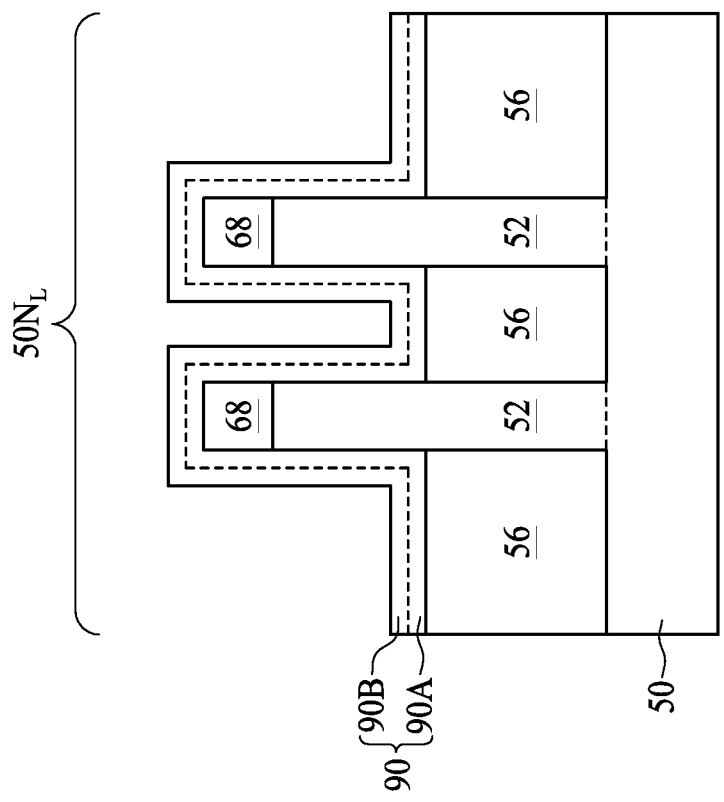
Figure 9B:
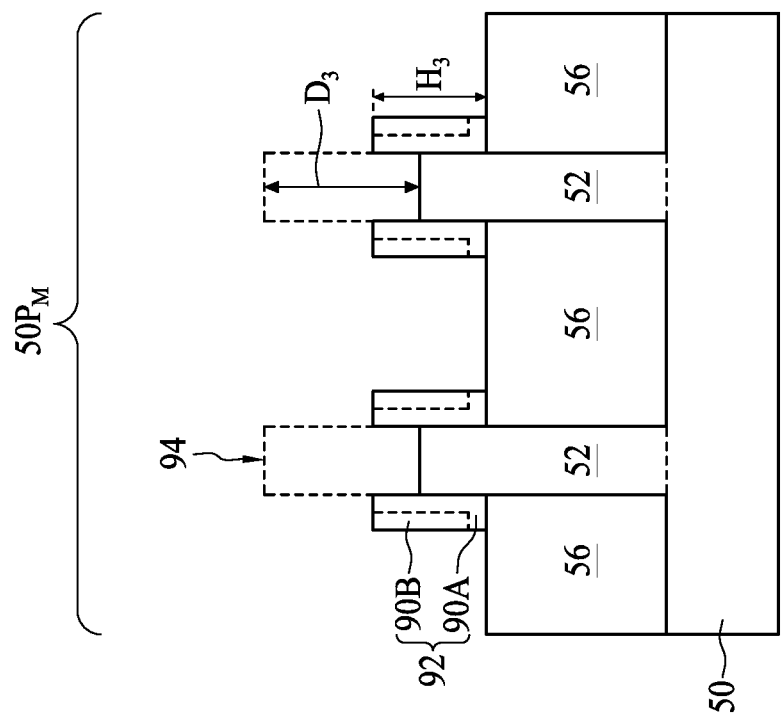
Figure 9A:
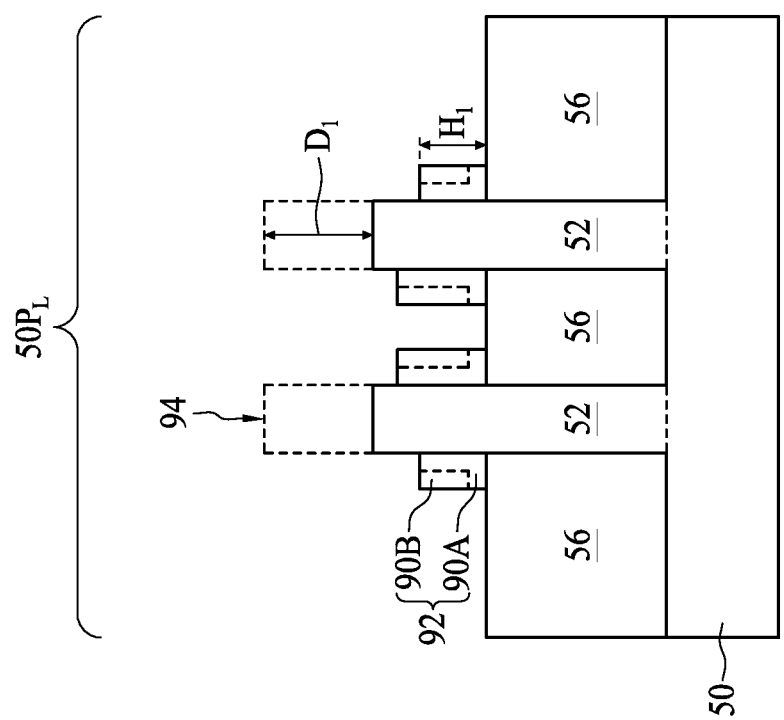
Figure 9D:
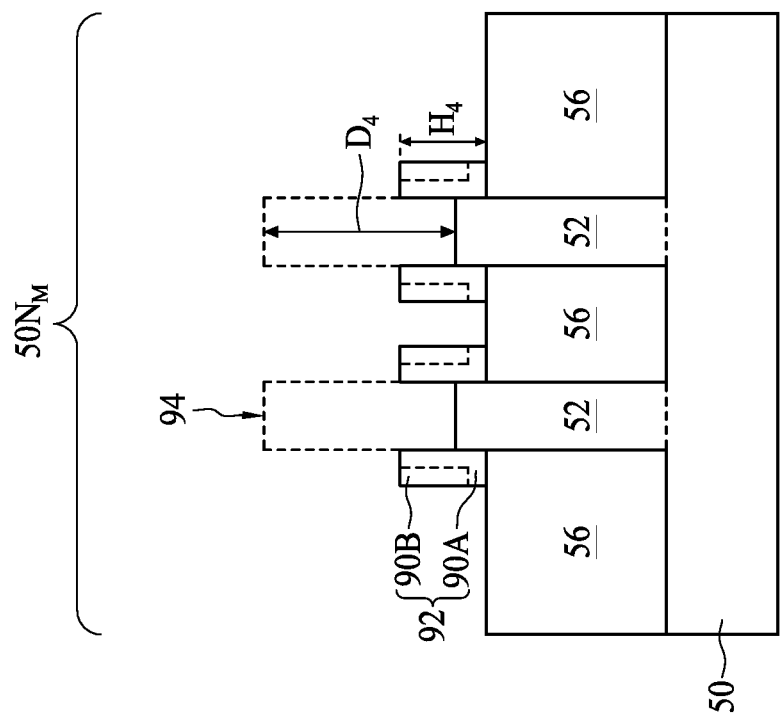
Figure 9C:
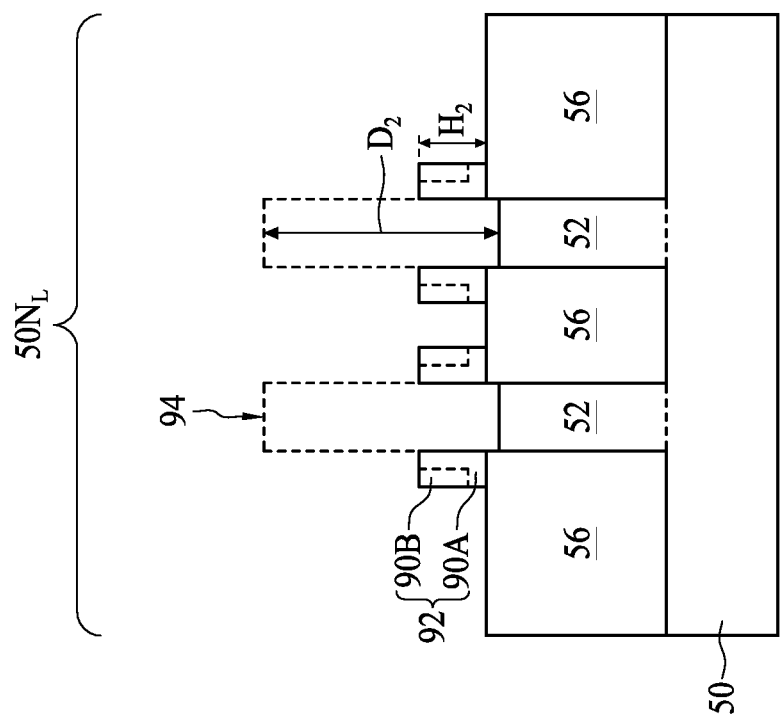
Figure 10B:
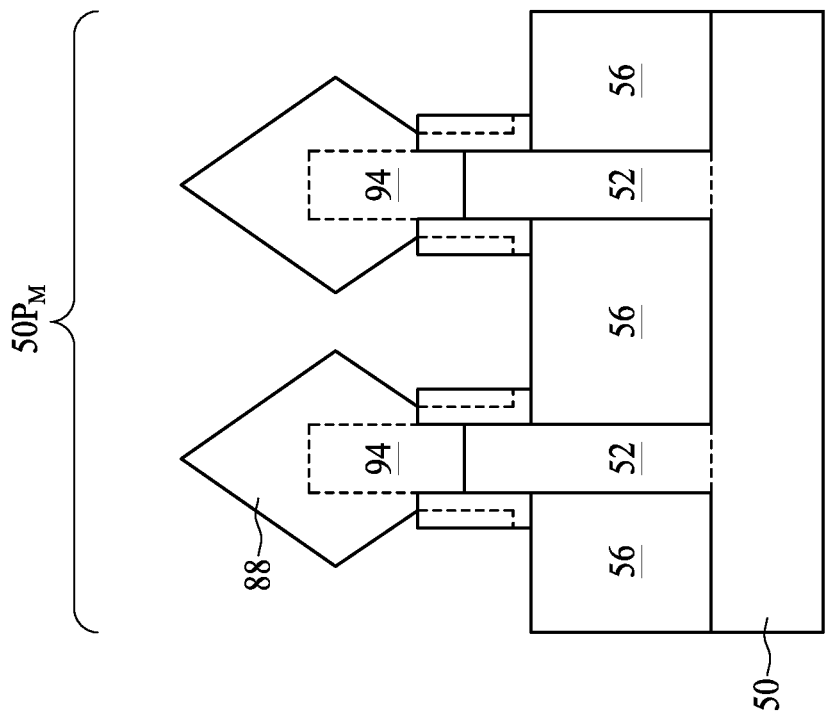
Figure 10A:
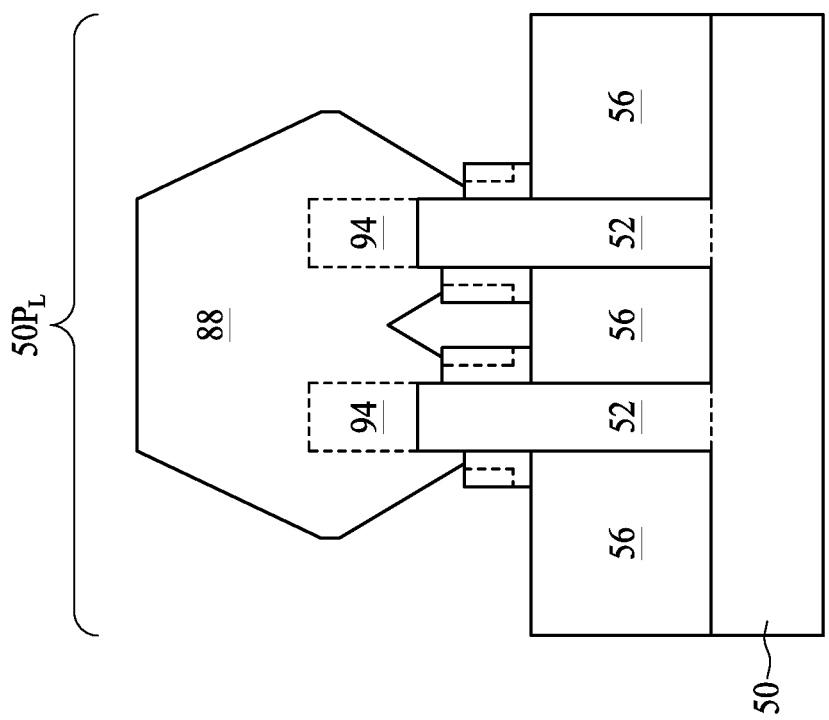
Figure 10D:
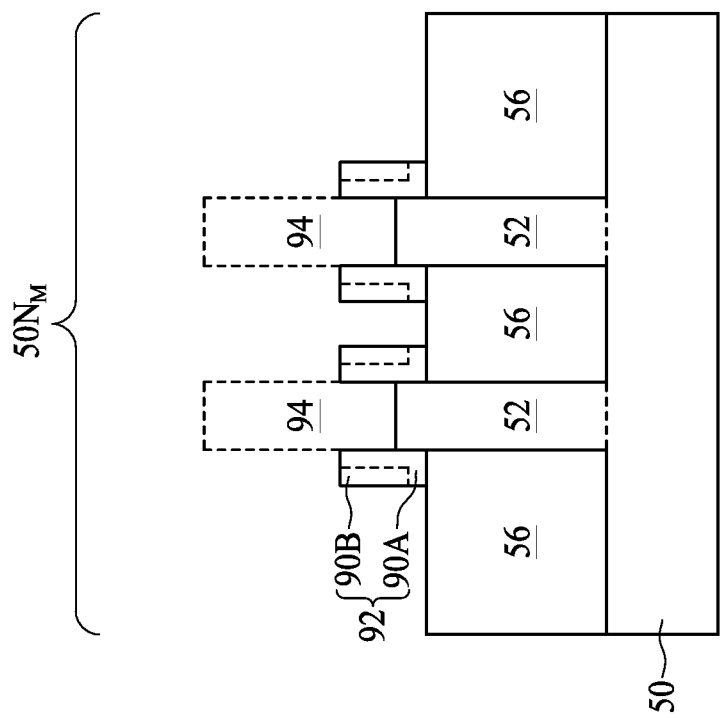
Figure 10C:
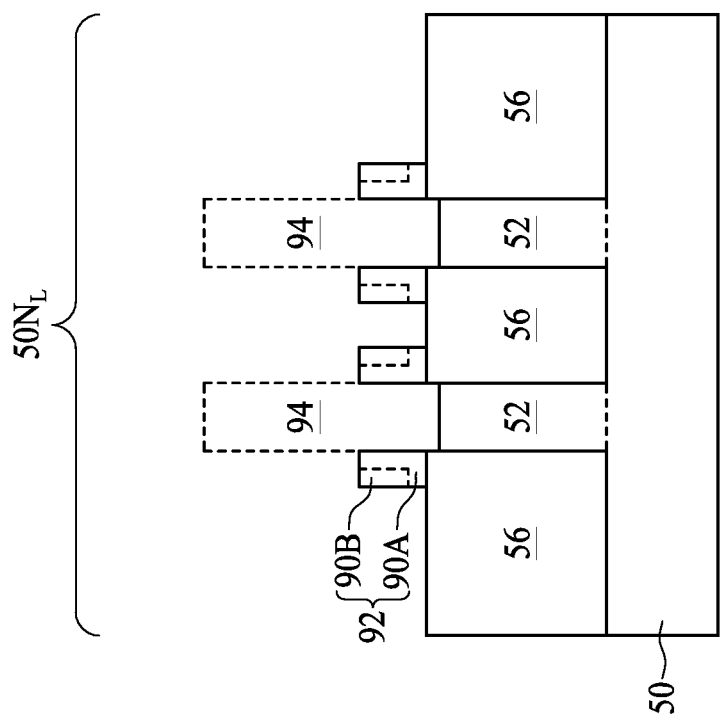

In FIGS. 7A and 7B, epitaxial source/drain regions 88 are formed in the fins 52. The epitaxial source/drain regions 88 are formed in the fins 52 such that each dummy gate 74 is disposed between respective neighboring pairs of the epitaxial source/drain regions 88. In some embodiments the epitaxial source/drain regions 88 may extend into, and may also penetrate through, the fins 52. In some embodiments, the gate spacers 82 are used to separate the epitaxial source/drain regions 88 from the dummy gates 74 by an appropriate lateral distance so that the epitaxial source/drain regions 88 do not short out subsequently formed gates of the resulting FinFETs. The material of the epitaxial source/drain regions 88 may be selected to exert stress in the respective channel regions 58, thereby improving performance. As will be discussed in greater detail below, the epitaxial source/drain regions 88 may be formed by etching recesses in the fins 52 and epitaxially growing the epitaxial source/drain regions 88 in the recesses.

The epitaxial source/drain regions 88 and/or the fins 52 may be implanted with dopants to form source/drain regions, similar to the process previously discussed for forming the LDD regions 86, followed by an anneal. The source/drain regions may have an impurity concentration in the range of about $10^{19}$ cm$^{-3}$ to about $10^{21}$ cm$^{-3}$. The n-type and/or p-type impurities for source/drain regions may be any of the impurities previously discussed. In some embodiments, the epitaxial source/drain regions 88 may be in situ doped during growth.

The epitaxial source/drain regions 88 may include one or more semiconductor material layers. For example, the epitaxial source/drain regions 88 may include liner layer 88A, main layers 88B, and finishing layers 88C. Any number of semiconductor material layers may be used for the epitaxial source/drain regions 88. Each of the liner layer 88A, the main layers 88B, and the finishing layers 88C may be formed of different semiconductor materials and/or may be doped to different dopant concentrations. In some embodiments, the liner layer 88A may have a dopant concentration less than the main layers 88B and greater than the finishing layers 88C. In embodiments in which the epitaxial source/drain regions 88 include three semiconductor material layers, the liner layer 88A may be grown from the fins 52, the main layers 88B may be grown from the liner layer 88A, and the finishing layers 88C may be grown from the main layers 88B.

FIGS. 8A through 11D illustrate a process for forming the epitaxial source/drain regions 88. Fin spacers 92 are formed on the sidewalls of the fins 52. The formation of the fin spacers 92 is controlled so that the fin spacers 92 have a different height in each of the regions $50P_L$, $50N_L$, $50P_M$, $50N^M$. During formation of the epitaxial source/drain regions 88, the fin spacers 92 block epitaxial growth on the top surfaces of the STI regions 56 so that the epitaxial source/drain regions 88 are grown with desired shapes in each of the regions $50P_L$, $50N_L$, $50P_M$, $50N_M$, depending on the height of the corresponding fin spacers 92 in each of the regions.

In FIGS. 8A through 8D, one or more spacer layer(s) 90 are formed on exposed surfaces of the fins 52 and the STI regions 56. The spacer layer(s) 90 are formed of one or more dielectric materials. Acceptable dielectric materials include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. The dielectric materials may be formed by a conformal deposition process such as chemical vapor deposition (CVD), plasma enhanced chemical vapor deposition (PECVD), atomic layer deposition (ALD), or the like. In some embodiments, each of the spacer layer(s) 90 are formed to extend across each of the regions $50P_L$, $50N_L$, $50P_M$, $50N_M$. In some embodiments, different spacer layer(s) 90 are formed in each of the regions $50P_L$, $50N_L$, $50P_M$, $50N_M$. The spacer layer(s) 90 may be formed to a uniform thickness in each of the regions $50P_L$, $50N_L$, $50P_M$, $50N_M$. In the illustrated embodiment, the spacer layer(s) 90 include multiple layers, e.g., first spacer layer(s) 90A and second spacer layer(s) 90B. In some embodiments, the first spacer layer(s) 90A and the second spacer layer(s) 90B are each formed of silicon oxycarbonitride (e.g., $SiO_xN_yC_{1-x-y}$, where x and y are in the range of 0 to 1). For example, the first spacer layer(s) 90A can be formed of a similar or a different composition of silicon oxycarbonitride than the second spacer layer(s) 90B.

In FIGS. 9A through 9D, the spacer layer(s) 90 are patterned to form fin spacers 92. The fin spacers 92 are formed on the sidewalls of the fins 52 and the top surfaces of the STI regions 56. An acceptable etch process, such as a dry etch, a wet etch, the like, or a combination thereof, may be performed to pattern the spacer layer(s) 90. The etching may be anisotropic. For example, the spacer layer(s) 90 can be patterned by anisotropically etching the second spacer layer(s) 90B using the first spacer layer(s) 90A as etch stop layers, and then anisotropically etching the first spacer layer(s) 90A using the patterned second spacer layer(s) 90B as an etching mask. The spacer layer(s) 90, when etched, have portions left on the sidewalls of the fins 52 (thus forming the fin spacers 92). After etching, the fin spacers 92 can have straight sidewalls (as illustrated) or can have curved sidewalls (not illustrated). As will be discussed in greater detail below, the fin spacers 92 in each of the regions $50P_L$, $50N_L$, $50P_M$, $50N_M$ can be formed by distinct etching processes.

The fin spacers 92 include inner fin spacers 92 (disposed between the fins 52 of a same device) and outer fin spacers 92 (disposed between the fins 52 of different devices). In the illustrated embodiments, the inner fin spacers 92 are separated after patterning, such that the STI regions 56 between the fins 52 of a same device are exposed. In another embodiment, the inner fin spacers 92 are not completely separated, such that portions of the spacer layer(s) 90 remain over the STI regions 56 between the fins 52 of a same device. Further, the inner fin spacers 92 and the outer fin spacers 92 in a same region may have different heights (see FIG. 9A) or may have the same height (see FIGS. 9B through 9D).

The etching of the spacer layer(s) 90 is controlled so that the fin spacers 92 have a different height in each of the regions $50P_L$, $50N_L$, $50P_M$, $50N_M$. Timed etch processes may be used to stop the etching of the spacer layer(s) 90 after the fin spacers 92 reach the desired heights. The fin spacers 92 in the p-type logic region $50P_L$ have a first height $H_1$ (see FIG. 9A), the fin spacers 92 in the n-type logic region $50N_L$ have a second height $H_2$ (see FIG. 9C), the fin spacers 92 in the p-type memory region $50P_M$ have a third height $H_3$ (see FIG. 9B), and the fin spacers 92 in the n-type memory region $50N_M$ have a fourth height $H_4$ (see FIG. 9D), where the heights are related according to: $H_3 > H_4 > H_1 > H_2$. Specifically, the fin spacers 92 in the p-type regions $50P_L$, $50P_M$ have greater heights than the fin spacers 92 in the n-type regions $50N_L$, $50N_M$, and the fin spacers 92 in the memory regions $50P_M$, $50N_M$ have greater heights than the fin spacers 92 in the logic regions $50P_L$, $50N_L$. Further, the height of the fin spacers 92 in each region is less than the original height of the fins 52 and is greater than the width of the fins 52. As will be discussed in greater detail below, controlling the heights of the fin spacers 92 allows for better control of the dimensions (e.g., width, height, etc.) of subsequently grown source/drain regions, and also allows control of whether the subsequently grown source/drain regions merge.

Further, source/drain recesses 94 are patterned in the fins 52. In the illustrated embodiment, the source/drain recesses 94 extend into the fins 52, and through the LDD regions 86. The source/drain recesses 94 may also extend into the substrate 50. The source/drain recesses 94 may be formed by etching the fins 52 using an anisotropic etching processes, such as a RIE, a NBE, or the like. Referring back to FIG. 7A, the gate spacers 82 and the masks 76 are collectively used as an etching mask to cover portions of the fins 52 during the etching processes used to form the source/drain recesses 94. As will be discussed in greater detail below, the source/drain recesses 94 in each of the regions $50P_L$, $50N_L$, $50P_M$, $50N_M$ can be formed by distinct etching processes.

The etching of the source/drain recesses 94 is controlled so that the source/drain recesses 94 have a different depth in each of the regions $50P_L$, $50N_L$, $50P_M$, $50N_M$. Timed etch processes may be used to stop the etching of the source/drain recesses 94 after the source/drain recesses 94 reach the desired depths. The source/drain recesses 94 in the p-type logic region $50P_L$ have a first depth $D_1$ (see FIG. 9A), the source/drain recesses 94 in the n-type logic region $50N_L$ have a second depth $D_2$ (see FIG. 9C), the source/drain recesses 94 in the p-type memory region $50P_M$ have a third depth $D_3$ (see FIG. 9B), and the source/drain recesses 94 in the n-type memory region $50N_M$ have a fourth depth $D_4$ (see FIG. 9D), where the depths are related according to: $D_1 < D_3$ and $D_2>D_4$. Further, the source/drain recesses 94 are etched such that the bottom surfaces of the source/drain recesses 94 in the p-type logic region $50P_L$ are disposed above the top surfaces of the fin spacers 92; the bottom surfaces of the source/drain recesses 94 in the n-type logic region $50N_L$ are disposed below the top surfaces of the STI regions 56; and the bottom surfaces of the source/drain recesses 94 in the p-type memory region $50P_M$ and the n-type memory region $50N_M$ are disposed below the top surfaces of the fin spacers 92 and above the top surfaces of the STI regions 56. As will be discussed in greater detail below, controlling the depths of the source/drain recesses 94 allows for better control of the dimensions (e.g., width, height, etc.) of subsequently grown source/drain regions, and also allows control of whether the subsequently grown source/drain regions merge.

In some embodiments, the fin spacers 92 and the source/drain recesses 94 are patterned by the same etching step. For example, an anisotropic etch, such as those described previously, may be performed to both etch the spacer layer(s) 90 (thus forming the fin spacers 92) and etch the fins 52 (thus forming the source/drain recesses 94). In another embodiment, the fin spacers 92 and the source/drain recesses 94 are patterned by different etching steps.

Various masking steps may be used to sequentially form the fin spacers 92 and the source/drain recesses 94 in each region. In some embodiments, the fin spacers 92 and the source/drain recesses 94 in each of the regions $50P_L$, $50N_L$, $50P_M$, $50N_M$ are separately formed by distinct processes while others of the regions $50P_L$, $50N_L$, $50P_M$, $50N_M$ are masked. For example, a photoresist may be formed over the spacer layer(s) 90 in the regions $50N_L$, $50P_M$, $50N_M$. The photoresist may be patterned to expose the spacer layer(s) 90 in the p-type logic region $50P_L$. The photoresist can be formed by using a spin-on technique and can be patterned using acceptable photolithography techniques. Once the photoresist is patterned, etching discussed previously may be performed in the p-type logic region $50P_L$ to form the fin spacers 92 and the source/drain recesses 94 in the p-type logic region $50P_L$, with the photoresist acting as a mask to substantially prevent etching in the regions $50N_L$, $50P_M$, $50N_M$. After the etching, the photoresist may be removed, such as by an acceptable ashing process. Similar masking and etching steps may be performed to form the fin spacers 92 and the source/drain recesses 94 in each of the regions $50N_L$, $50P_M$, $50N_M$. The regions $50P_L$, $50N_L$, $50P_M$, $50N_M$ may be processed in any order.

In the illustrated embodiment, the spacer layer(s) 80 (see FIGS. 5A and 5B) are different from the spacer layer(s) 90 (see FIGS. 8A and 8B) and are formed of different materials. The materials may be selected so that the gate spacers 82 have a high etching selectivity from the etching of the fin spacers 92. As such, the etching steps for patterning the fin spacers 92 and the source/drain recesses 94 can etch the material(s) of the spacer layer(s) 90 at a faster rate than the material(s) of the spacer layer(s) 80. In another embodiment, one set of spacer layer(s) is formed, and the spacer layer(s) are etch so that they have first portions left on the sidewalls of the dummy gates 74 (thus forming the gate spacers 82) and second portions left on the sidewalls of the fins 52 (thus forming the fin spacers 92). In other words, the gate spacers 82 may be formed by the same process for forming the fin spacers 92.

In FIGS. 10A through 10D, the epitaxial source/drain regions 88 are grown in the source/drain recesses 94 in the p-type regions $50P_L$, $50P_M$. The epitaxial source/drain regions 88 in the p-type regions $50P_L$, $50P_M$ may be formed of any acceptable material appropriate for p-type FinFETs. For example, if the fins 52 are silicon, the epitaxial source/drain regions 88 in the p-type regions $50P_L$, $50P_M$ may include materials exerting a compressive strain in the channel regions 58, such as silicon germanium, boron doped silicon germanium, germanium, germanium tin, or the like. The epitaxial source/drain regions 88 in the p-type regions $50P_L$, $50P_M$ may have surfaces raised from respective surfaces of the fins 52, and may have facets. The n-type regions $50N_L$, $50N_M$ may be masked (e.g., with a photoresist) while the epitaxial source/drain regions 88 are grown in the p-type regions $50P_L$, $50P_M$, so that the epitaxial source/drain regions 88 for p-type FinFETs are not grown in the n-type regions $50N_L$, $50N_M$.

In FIGS. 11A through 11D, the epitaxial source/drain regions 88 are grown in the source/drain recesses 94 in the n-type regions $50N_L$, $50N_M$. The epitaxial source/drain regions 88 in the n-type regions $50N_L$, $50N_M$ may be formed of any acceptable material appropriate for n-type FinFETs. For example, if the fins 52 are silicon, the epitaxial source/drain regions 88 in the n-type regions $50N_L$, $50N_M$ may include materials exerting a tensile strain in the channel regions 58, such as silicon, silicon carbide, phosphorous doped silicon carbide, silicon phosphide, or the like. The epitaxial source/drain regions 88 in the n-type regions $50N_L$, $50N_M$ may have surfaces raised from respective surfaces of the fins 52, and may have facets. The p-type regions $50P_L$, $50P_M$ may be masked (e.g., with a photoresist) while the epitaxial source/drain regions 88 are grown in the n-type regions $50N_L$, $50N_M$, so that the epitaxial source/drain regions 88 for n-type FinFETs are not grown in the p-type regions $50P_L$, $50P_M$.

It some be appreciated that the processes described herein may be varied. For example, the fin spacers 92, the source/drain recesses 94, and the epitaxial source/drain regions 88 may each be formed in first regions (e.g., the p-type regions $50P_L$, $50P_M$) before they are formed in second regions (e.g., the n-type regions $50N_L$, $50N_M$). Further, the regions may be processed in any acceptable order.

Figure 11B:
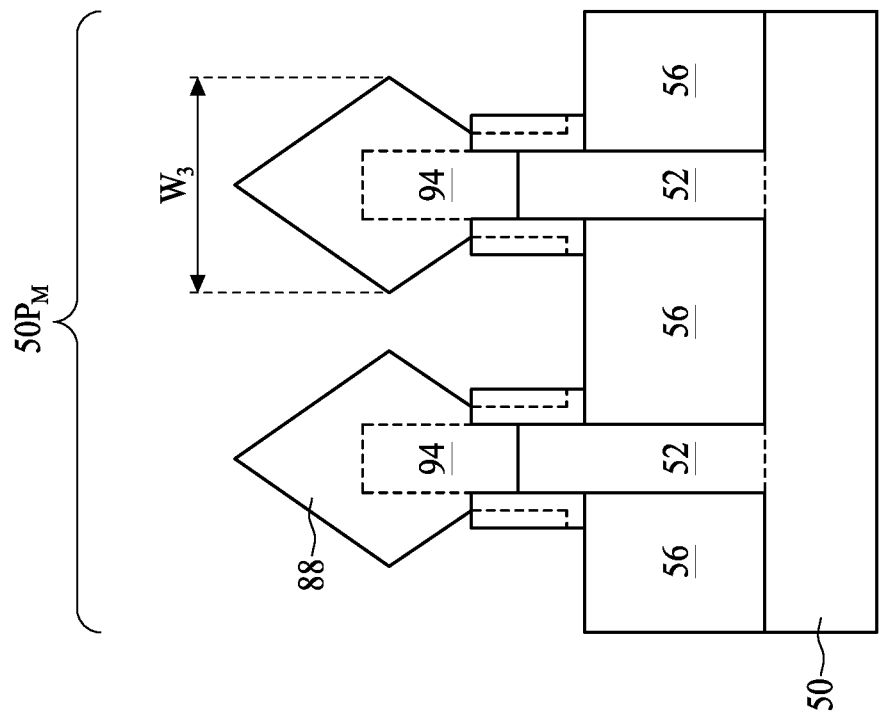
Figure 11A:
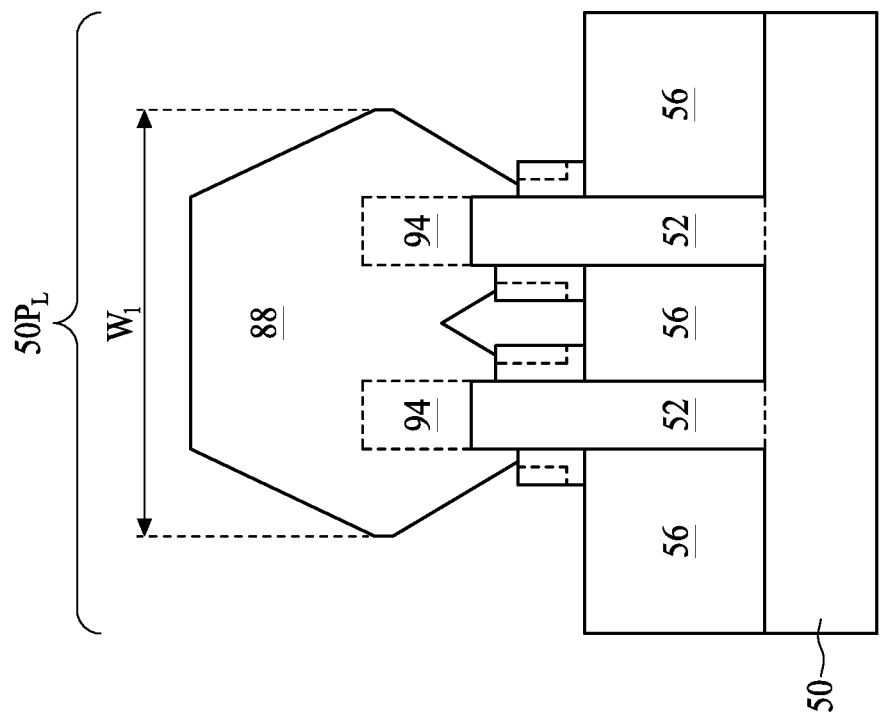
Figure 11D:
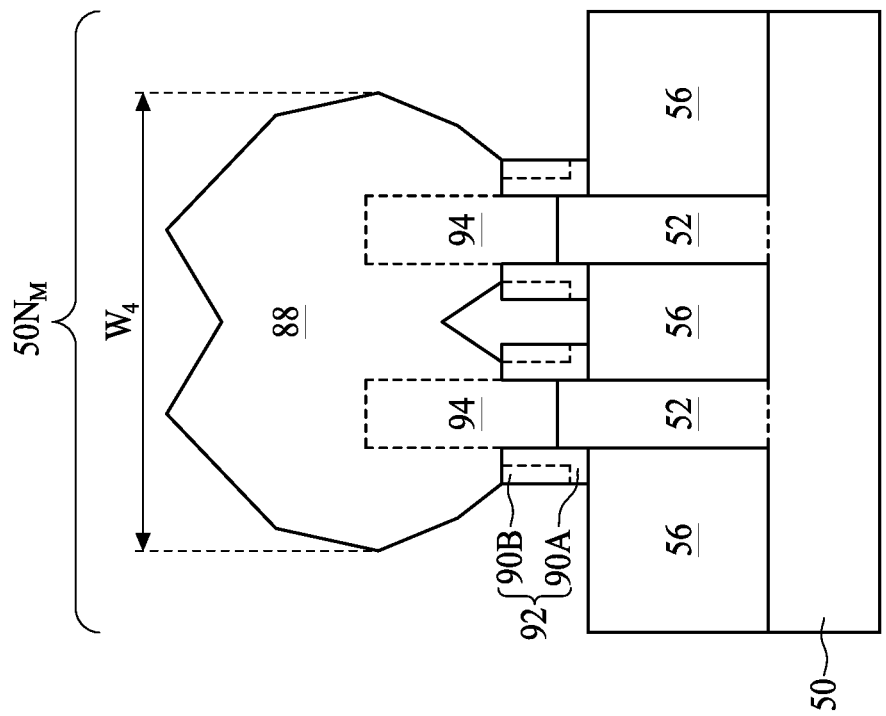
Figure 11C:
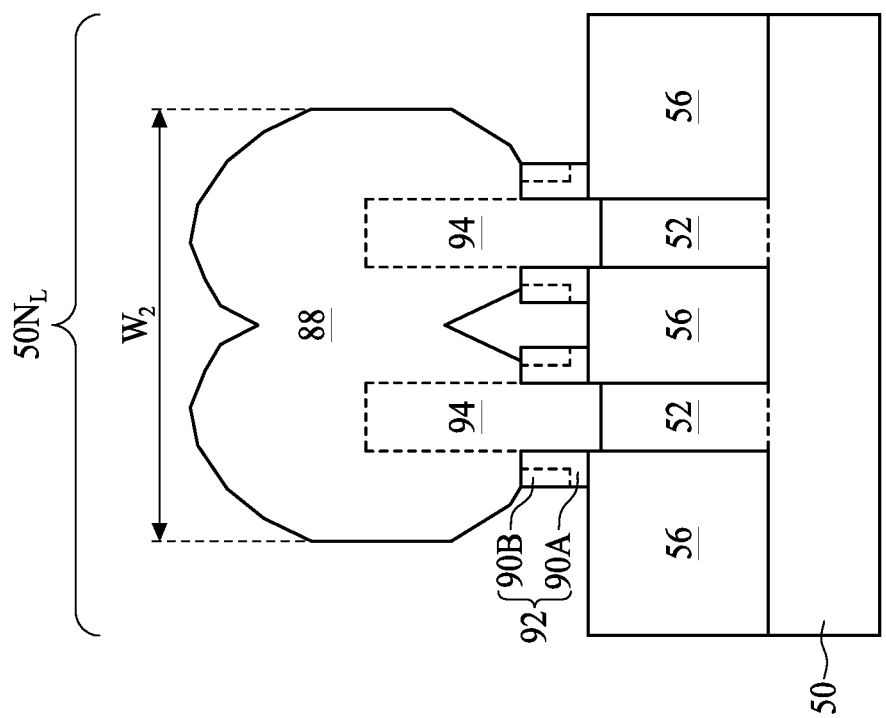

As a result of the epitaxy processes used to form the epitaxial source/drain regions 88, upper surfaces of the epitaxial source/drain regions 88 have facets which expand laterally outward beyond surfaces of the fins 52. These facets can cause adjacent epitaxial source/drain regions 88 of a same device to merge, as illustrated by FIGS. 11A, 11C, and 11D. Some adjacent epitaxial source/drain regions 88 remain separated, as illustrated by FIG. 11B. As will be discussed in greater detail below, adjacent epitaxial source/drain regions 88 in some regions of a die may merge while adjacent epitaxial source/drain regions 88 in other regions of the die may remain separated. The heights $H_1$-$H_4$ of the fin spacers 92 (discussed above for FIGS. 9A through 9D) and the depths $D_1$-$D_4$ of the source/drain recesses 94 (discussed above for FIGS. 9A through 9D) can contribute to determining whether the adjacent epitaxial source/drain regions 88 merge or remain separated. The fin spacers 92 block epitaxial growth on the top surfaces of the STI regions 56.

Because the fin spacers 92 are formed to different heights in the different regions, and because the source/drain recesses 94 are formed to different depths in the different regions, the epitaxial source/drain regions 88 have different dimensions in the different regions. Specifically, the epitaxial source/drain regions 88 have different widths in each of the regions $50P_L$, $50N_L$, $50P_M$, $50N_M$. Because of differences in the epitaxial growth of different materials, forming the fin spacers 92 to greater heights in the p-type regions $50P_L$, $50P_M$ allows the epitaxial source/drain regions 88 to be formed to lesser widths in the p-type regions $50P_L$, $50P_M$, and forming the fin spacers 92 to greater heights in the n-type regions $50N_L$, $50N_M$ allows the epitaxial source/drain regions 88 to be formed to greater widths in the n-type regions $50N_L$, $50N_M$. The epitaxial source/drain regions 88 in the p-type logic region $50P_L$ have a first width $W_1$ (see FIG. 11A), the epitaxial source/drain regions 88 in the n-type logic region $50N_L$ have a second width $W_2$ (see FIG. 11C), the epitaxial source/drain regions 88 in the p-type memory region $50P_M$ have a third width $W_3$ (see FIG. 11B), and the epitaxial source/drain regions 88 in the n-type memory region $50N_M$ have a fourth width $W_4$ (see FIG. 11C), where the widths are related according to: $W_1 > W_2$ and $W_4 > W_3$. Specifically, the epitaxial source/drain regions 88 in the p-type logic region $50P_L$ have a greater width than the epitaxial source/drain regions 88 in the n-type logic region $50N_L$, and the epitaxial source/drain regions 88 in the p-type memory region $50P_M$ have a lesser width than the epitaxial source/drain regions 88 in the n-type memory region $50N_M$.

Because they are formed of different epitaxial materials, a greater contact area to the epitaxial source/drain regions 88 in the p-type regions than in the n-type regions is desired for logic devices. Forming the epitaxial source/drain regions 88 in the p-type logic region $50P_L$ (see FIG. 11A) to a greater width than the epitaxial source/drain regions 88 in the n-type logic region $50N_L$ (see FIG. 11C) allows for a reduction in the contact resistance to the epitaxial source/drain regions 88 in the p-type logic region $50P_L$, improving the performance and efficiency of the p-type FinFETs for logic devices.

Forming p-type FinFETs with unmerged epitaxial source/drain regions 88 and n-type FinFETs with merged epitaxial source/drain regions 88 is desired for some types of memory devices (e.g., SRAMs). Forming the epitaxial source/drain regions 88 in the p-type memory region $50P_M$ (see FIG. 11B) to a lesser width than the epitaxial source/drain regions 88 in the n-type memory region $50N_M$ (see FIG. 11D) helps avoid merging of the epitaxial source/drain regions 88 in the p-type memory region $50P_M$, which can allow for simplification of the memory device layout. The chip area and manufacturing costs may thus be reduced.

Referring to FIGS. 11A and 11C, some differences between the logic regions $50P_L$, $50N_L$ are described. The width $W_1$ can be in the range of about 50 nm to about 90 nm, and the width $W_2$ can be in the range of about 40 nm to about 80 nm, with the width $W_1$ being greater than the width $W_2$. In some embodiments, the ratio of the width $W_1$ to the width $W_2$ is in the range of about 1.05 to about 1.8. As an example to form such epitaxial source/drain regions 88, the height $H_1$ (see FIG. 9A) can be in the range of about 10 nm to about 20 nm, and the height $H_2$ (see FIG. 9C) can be in the range of about 5 nm to about 15 nm, with the height $H_1$ being greater than the height $H_2$. Similarly, the depth $D_1$ (see FIG. 9A) can be in the range of about 30 nm to about 50 nm, and the depth $D_2$ (see FIG. 9C) can be in the range of about 45 nm to about 65 nm, with the depth $D_1$ being less than the depth $D_2$. In some embodiments, the ratio of the height $H_1$ to the height $H_2$ is in the range of about 1 to about 2, and the ratio of the depth $D_1$ to the depth $D_2$ is in the range of about 0.5 to about 1. As a result, the epitaxial source/drain regions 88 in the p-type logic region $50P_L$ can have cone shapes (e.g., flat or convex top surfaces), and the epitaxial source/drain regions 88 in the n-type logic region $50N_L$ can have wavy shapes (e.g., concave top surfaces). Further, the epitaxial source/drain regions 88 in the p-type logic region $50P_L$ and the epitaxial source/drain regions 88 in the n-type logic region $50N_L$ can have similar volumes, even when they have different shapes. Because of differences in the epitaxial growth of different materials, forming the fin spacers 92 in the p-type logic region $50P_L$ and the n-type logic region $50N_L$ to different heights can improve uniformity of the volume of the epitaxial source/drain regions 88 when merging occurs.

Referring to FIGS. 11B and 11D, some differences between the memory regions $50P_M$, $50N_M$ are described. The width $W_3$ can be in the range of about 20 nm to about 50 nm, and the width $W_4$ can be in the range of about 40 nm to about 75 nm, with the width $W_3$ being less than the width $W_4$. In some embodiments, the ratio of the width $W_3$ to the width $W_4$ is in the range of about 0.3 to about 0.45. More particularly, the epitaxial source/drain regions 88 in the p-type memory region $50P_M$ are unmerged, and so the width $W_4$ is greater than twice the width $W_3$. As an example to form such epitaxial source/drain regions 88, the height $H_3$ (see FIG. 9B) can be in the range of about 20 nm to about 40 nm, and the height $H_4$ (see FIG. 9D) can be in the range of about 10 nm to about 25 nm, with the height $H_3$ being greater than the height $H_4$. Similarly, the depth $D_3$ (see FIG. 9B) can be in the range of about 15 nm to about 35 nm, and the depth $D_4$ (see FIG. 9D) can be in the range of about 40 nm to about 60 nm, with the depth $D_3$ being less than the depth $D_4$. In some embodiments, the ratio of the height $H_3$ to the height $H_4$ is in the range of about 1 to about 2, and the ratio of the depth $D_3$ to the depth $D_4$ is in the range of about 0.4 to about 0.8. As a result, the epitaxial source/drain regions 88 in the p-type memory region $50P_M$ can have diamond shapes (e.g., convex top surfaces), and the epitaxial source/drain regions 88 in the n-type memory region $50N_M$ can have wavy shapes (e.g., concave top surfaces). Further, the epitaxial source/drain regions 88 in the p-type memory region $50P_M$ can have a lesser volume than the epitaxial source/drain regions 88 in the n-type memory region $50N_M$. For example, the epitaxial source/drain regions 88 in the p-type memory region $50P_M$ can have a volume that is from about 25% to about 40% of the volume of the epitaxial source/drain regions 88 in the n-type memory region $50N_M$.

Referring to FIGS. 11A and 11B, some differences between the p-type regions $50P_L$, $50P_M$ are described. The width $W_1$ is greater than the width $W_3$. In some embodiments, the ratio of the width $W_1$ to the width $W_3$ is in the range of about 2 to about 3. More particularly, the epitaxial source/drain regions 88 in the p-type memory region $50P_M$ are unmerged, and so the width $W_1$ is greater than twice the width $W_3$. As an example to form such epitaxial source/drain regions 88, the height $H_1$ (see FIG. 9A) can be less than the height $H_3$ (see Figure B), and the depth $D_1$ (see FIG. 9A) can be less than the depth $D_3$ (see FIG. 9B). In some embodiments, the ratio of the height $H_1$ to the height $H_3$ is in the range of about 0.1 to about 0.5, and the ratio of the depth $D_1$ to the depth $D_3$ is in the range of about 0.4 to about 0.8.

Referring to FIGS. 11C and 11D, some differences between the n-type regions $50N_L$, $50N_M$ are described. The width $W_2$ is greater than the width $W_4$. In some embodiments, the ratio of the width $W_2$ to the width $W_4$ is in the range of about 1 to about 2. As an example to form such epitaxial source/drain regions 88, the height $H_2$ (see FIG. 9C) can be less than the height $H_4$ (see FIG. 9D), and the depth $D_2$ (see FIG. 9C) can be greater than the depth $D_4$ (see FIG. 9D). In some embodiments, the ratio of the height $H_2$ to the height $H_4$ is in the range of about 0.1 to about 0.5, and the ratio of the depth $D_2$ to the depth $D_4$ is in the range of about 1 to about 3.

Figure 12B:
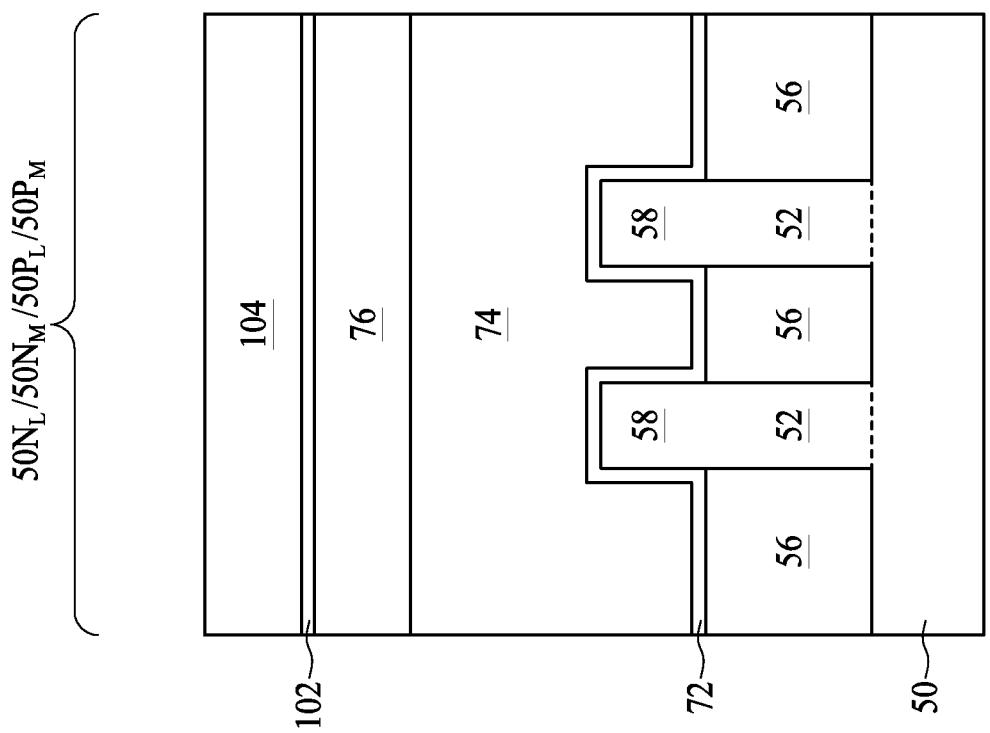
Figure 12A:
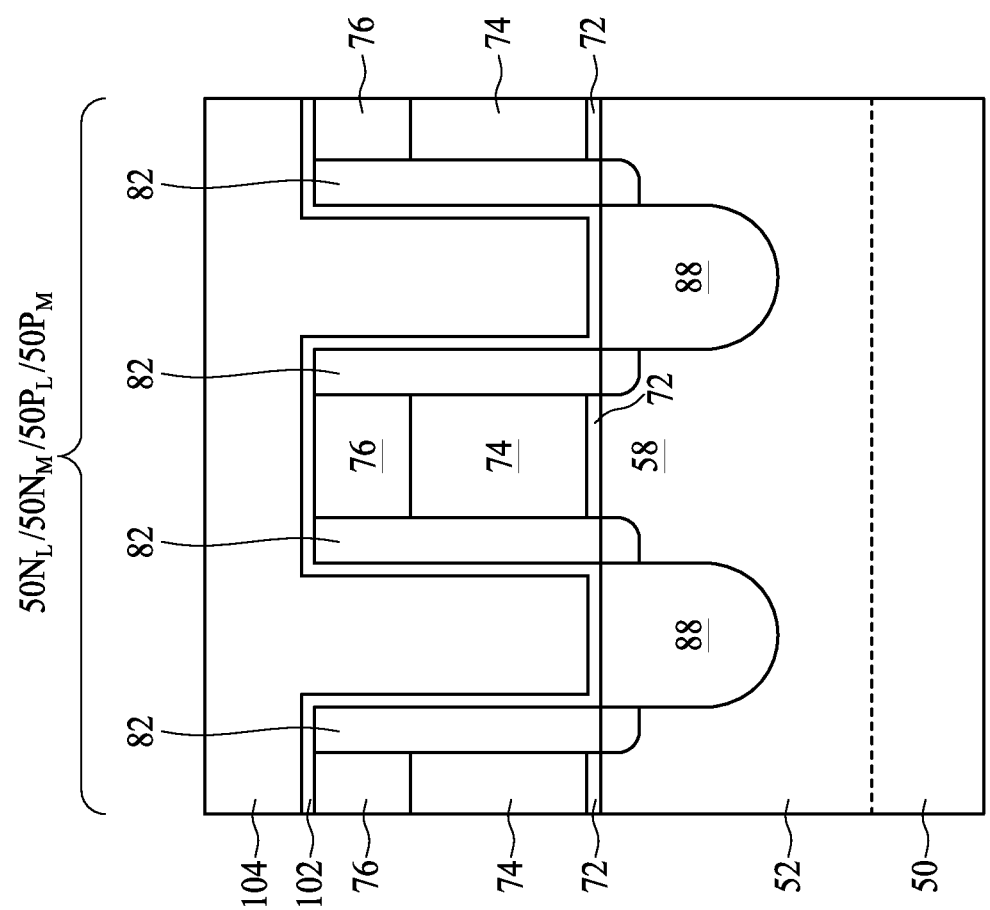

In FIGS. 12A and 12B, the first ILD 104 is deposited over the epitaxial source/drain regions 88, the gate spacers 82, and the masks 76 (if present) or the dummy gates 74. The first ILD 104 may be formed of a dielectric material, and may be deposited by any suitable method, such as CVD, plasma-enhanced CVD (PECVD), or FCVD. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 102 is formed between the first ILD 104 and the epitaxial source/drain regions 88, the gate spacers 82, and the masks 76 (if present) or the dummy gates 74. The CESL 102 may comprise a dielectric material, such as, silicon nitride, silicon oxide, silicon oxynitride, or the like, having a lower etch rate than the material of the first ILD 104.

Figure 13B:
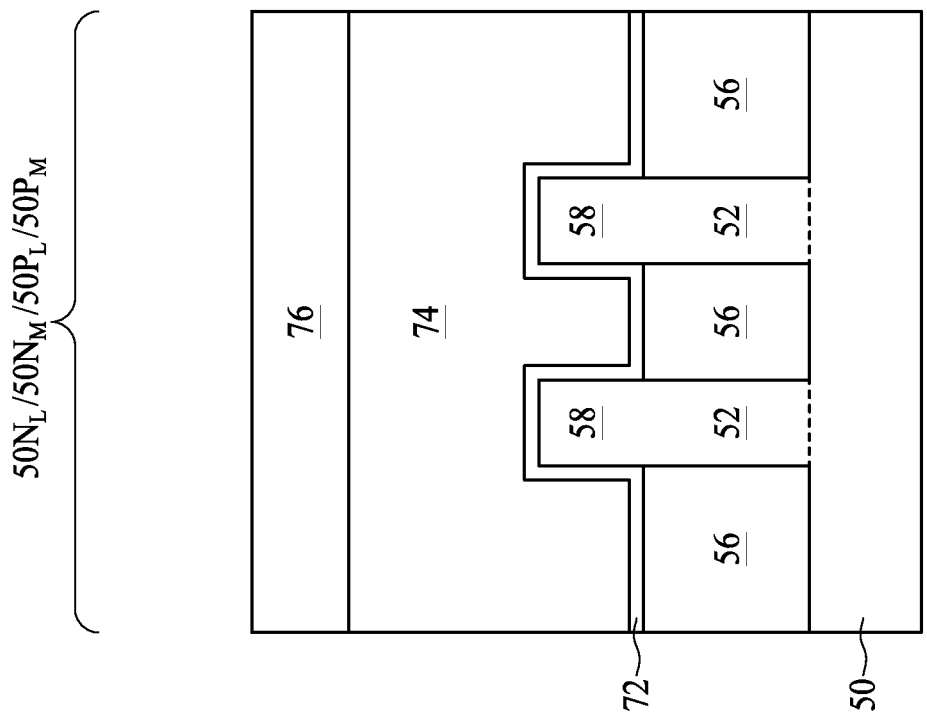
Figure 13A:
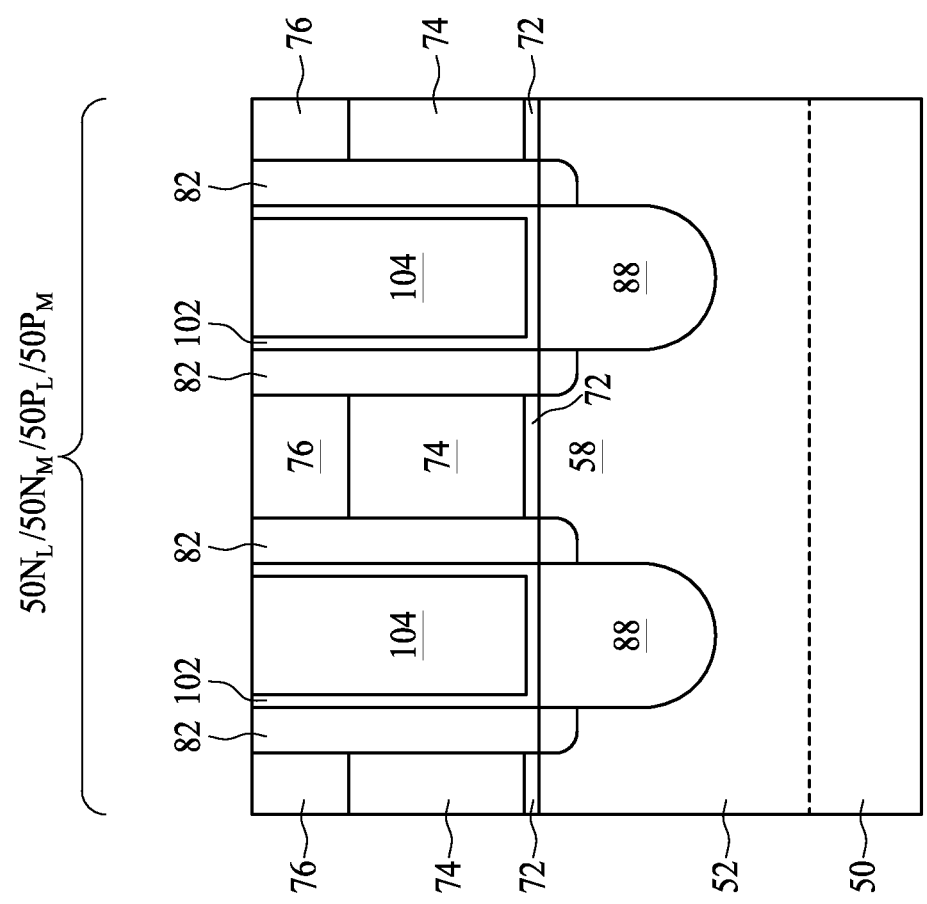

In FIGS. 13A and 13B, a planarization process, such as a CMP, may be performed to level the top surface of the first ILD 104 with the top surfaces of the masks 76 (if present) or the dummy gates 74. The planarization process may also remove the masks 76 on the dummy gates 74, and portions of the gate spacers 82 along sidewalls of the masks 76. After the planarization process, the top surfaces of the dummy gates 74, the gate spacers 82, the CESL 102, and the first ILD 104 are coplanar (within process variations). Accordingly, the top surfaces of the dummy gates 74 are exposed through the first ILD 104. In some embodiments, the masks 76 may remain, in which case the planarization process levels the top surface of the first ILD 104 with the top surfaces of the masks 76.

Figure 14B:
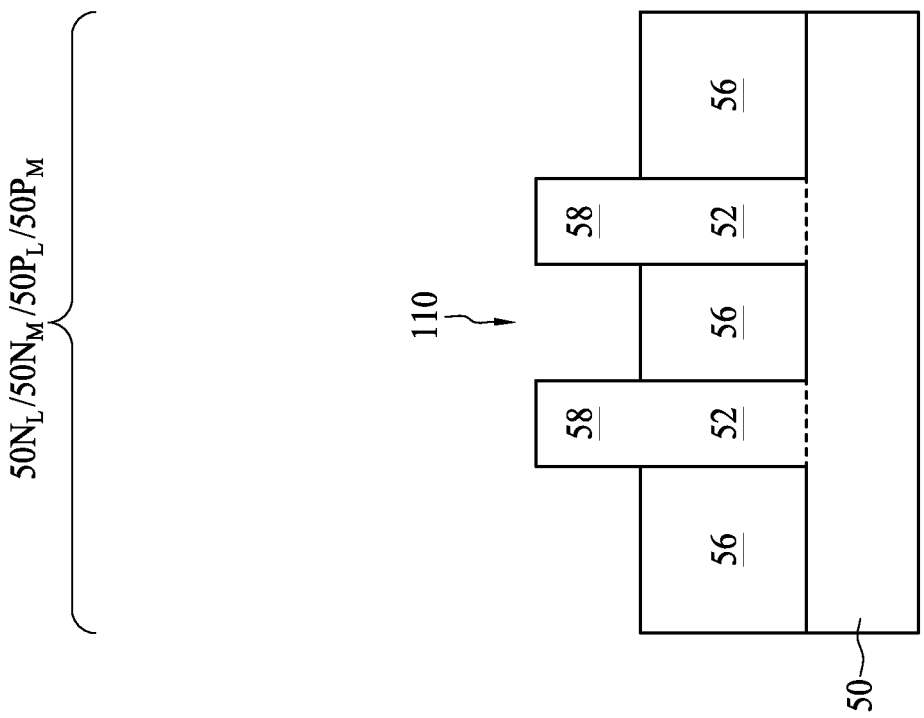
Figure 14A:
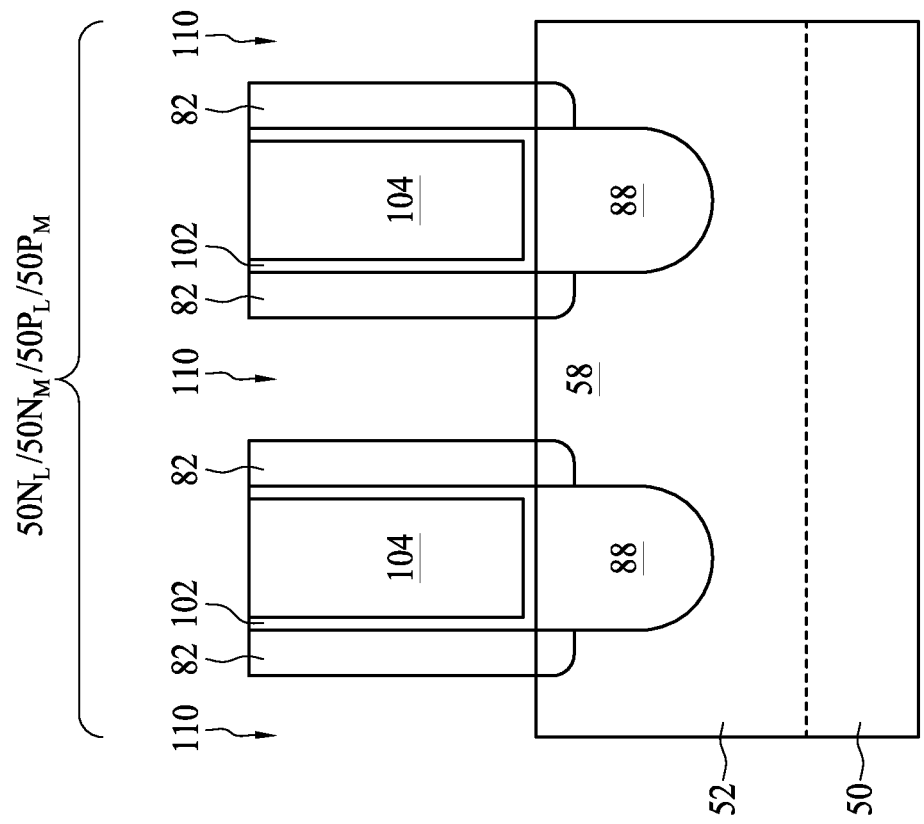

In FIGS. 14A and 14B, the masks 76 (if present) and the dummy gates 74 are removed in one or more etching step(s), so that recesses 110 are formed. Portions of the dummy dielectrics 72 in the recesses 110 may also be removed. In some embodiments, only the dummy gates 74 are removed and the dummy dielectrics 72 remain and are exposed by the recesses 110. In some embodiments, the dummy dielectrics 72 are removed from recesses 110 in a first region of a die (e.g., a core logic region) and remain in recesses 110 in a second region of the die (e.g., an input/output region). In some embodiments, the dummy gates 74 are removed by an anisotropic dry etch process. For example, the etching process may include a dry etch process using reaction gas(es) that selectively etch the dummy gates 74 at a faster rate than the first ILD 104 or the gate spacers 82. Each recess 110 exposes and/or overlies a channel region 58 of a respective fin 52. During the removal, the dummy dielectrics 72 may be used as etch stop layers when the dummy gates 74 are etched. The dummy dielectrics 72 may then be optionally removed after the removal of the dummy gates 74.

Figure 15B:
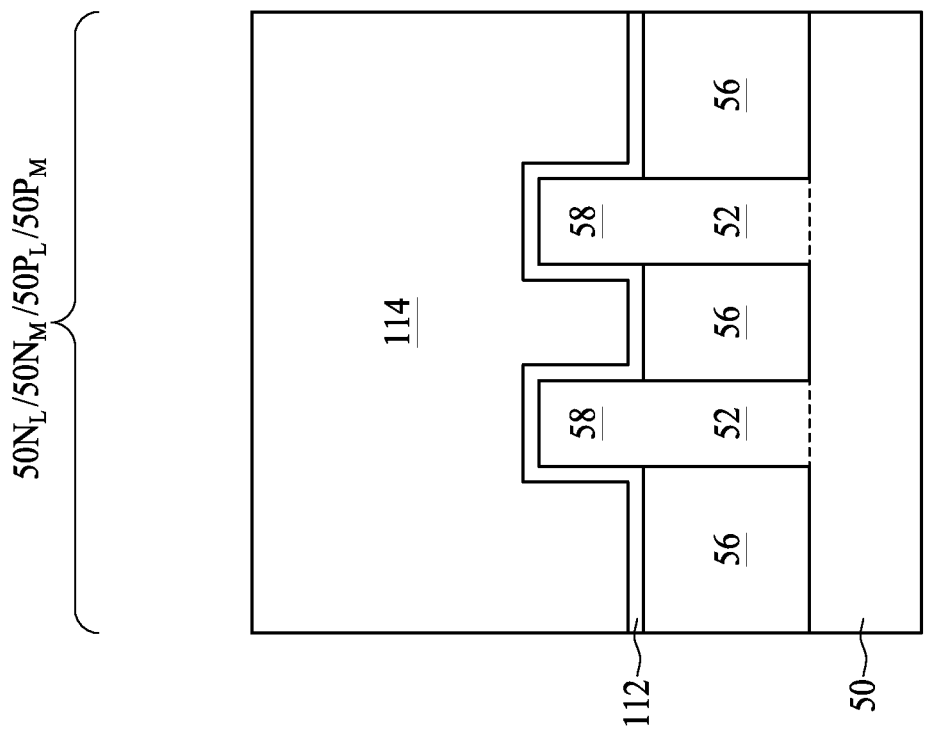
Figure 15A:
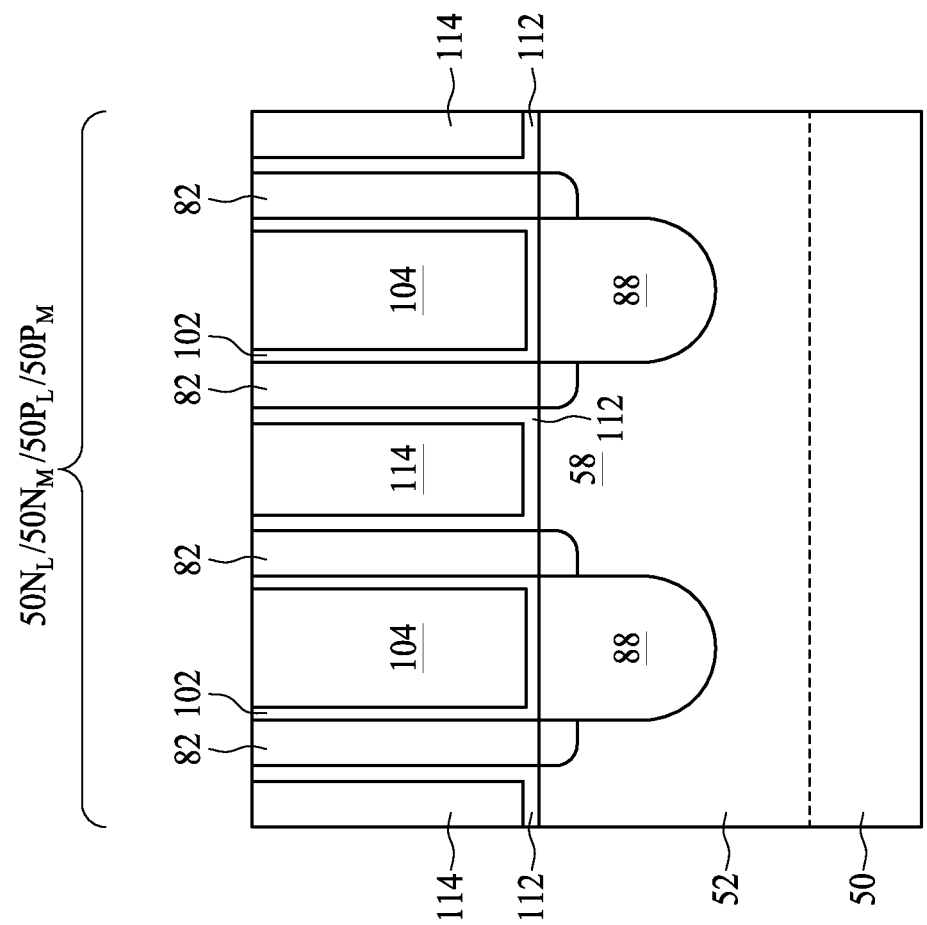

In FIGS. 15A and 15B, gate dielectrics 112 and gate electrodes 114 are formed for replacement gates. The gate dielectrics 112 include one or more layers deposited in the recesses 110, such as on the top surfaces and the sidewalls of the fins 52 and on sidewalls of the gate spacers 82. In some embodiments, the gate dielectrics 112 comprise one or more dielectric layers, such as one or more layers of silicon oxide, silicon nitride, metal oxide, metal silicate, or the like. For example, in some embodiments, the gate dielectrics 112 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectrics 112 may include a dielectric layer having a k-value greater than about 7.0. The formation methods of the gate dielectrics 112 may include Molecular-Beam Deposition (MBD), ALD, PECVD, and the like. In embodiments where portions of the dummy dielectrics 72 remain in the recesses 110, the gate dielectrics 112 include a material of the dummy dielectrics 72 (e.g., silicon oxide).

The gate electrodes 114 are deposited over the gate dielectrics 112, respectively, and fill the remaining portions of the recesses 110. The gate electrodes 114 may include a metal-containing material such as titanium nitride, titanium oxide, tantalum nitride, tantalum carbide, cobalt, ruthenium, aluminum, tungsten, combinations thereof, or multi-layers thereof. For example, although single layered gate electrodes 114 are illustrated, the gate electrodes 114 may include any number of liner layers, any number of work function tuning layers, and a fill material. After the filling of the recesses 110, a planarization process, such as a CMP, may be performed to remove the excess portions of the materials of the gate dielectrics 112 and the gate electrodes 114, which excess portions are over the top surfaces of the first ILD 104. The top surfaces of the gate spacers 82, the CESL 102, the first ILD 104, the gate dielectrics 112, and the gate electrodes 114 are thus coplanar (within process variations). The remaining portions of the materials of the gate dielectrics 112 and the gate electrodes 114 thus form replacement gates of the resulting FinFETs. The gate dielectrics 112 and the gate electrodes 114 may each be collectively referred to as a "gate structure." The gate structures each extend along sidewalls of a channel region 58 of the fins 52.

The formation of the gate dielectrics 112 in the n-type region 50N and the p-type region 50P may occur simultaneously such that the gate dielectrics 112 in each region are formed of the same materials, and the formation of the gate electrodes 114 may occur simultaneously such that the gate electrodes 114 in each region are formed of the same materials. In some embodiments, the gate dielectrics 112 in each region may be formed by distinct processes, such that the gate dielectrics 112 may be different materials, and/or the gate electrodes 114 in each region may be formed by distinct processes, such that the gate electrodes 114 may be different materials. Various masking steps may be used to mask and expose appropriate regions when using distinct processes.

Figure 16B:
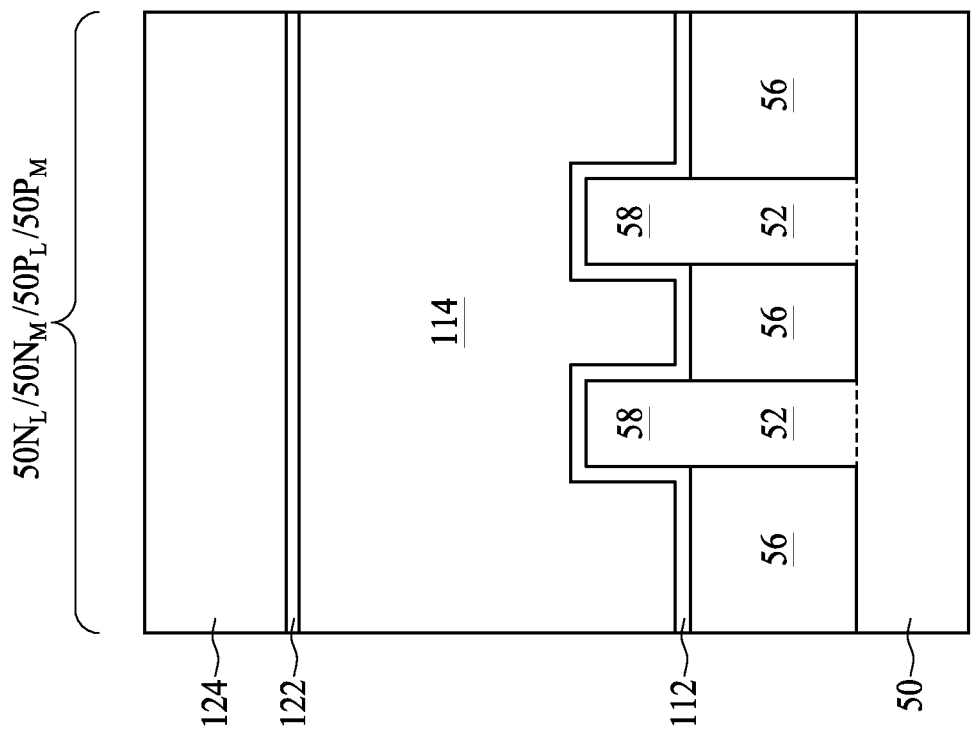
Figure 16A:
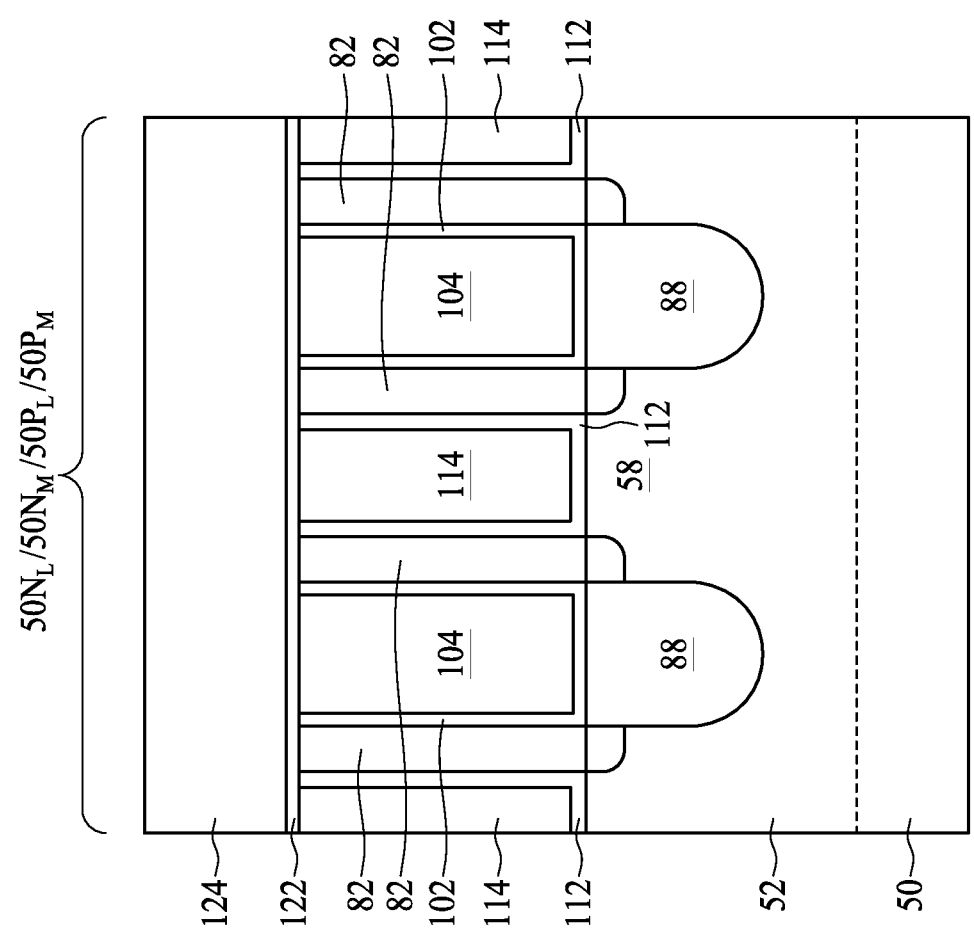

In FIGS. 16A and 16B, a second ILD 124 is deposited over the gate spacers 82, the CESL 102, the first ILD 104, the gate dielectrics 112, and the gate electrodes 114. In some embodiments, the second ILD 124 is a flowable film formed by a flowable CVD method. In some embodiments, the second ILD 124 is formed of a dielectric material such as PSG, BSG, BPSG, USG, or the like, and may be deposited by any suitable method, such as CVD and PECVD.

In some embodiments, an etch stop layer (ESL) 122 is formed between the second ILD 124 and the gate spacers 82, the CESL 102, the first ILD 104, the gate dielectrics 112, and the gate electrodes 114. The ESL 122 may comprise a dielectric material, such as, silicon nitride, silicon oxide, silicon oxynitride, or the like, having a lower etch rate than the material of the second ILD 124.

Figure 17B:
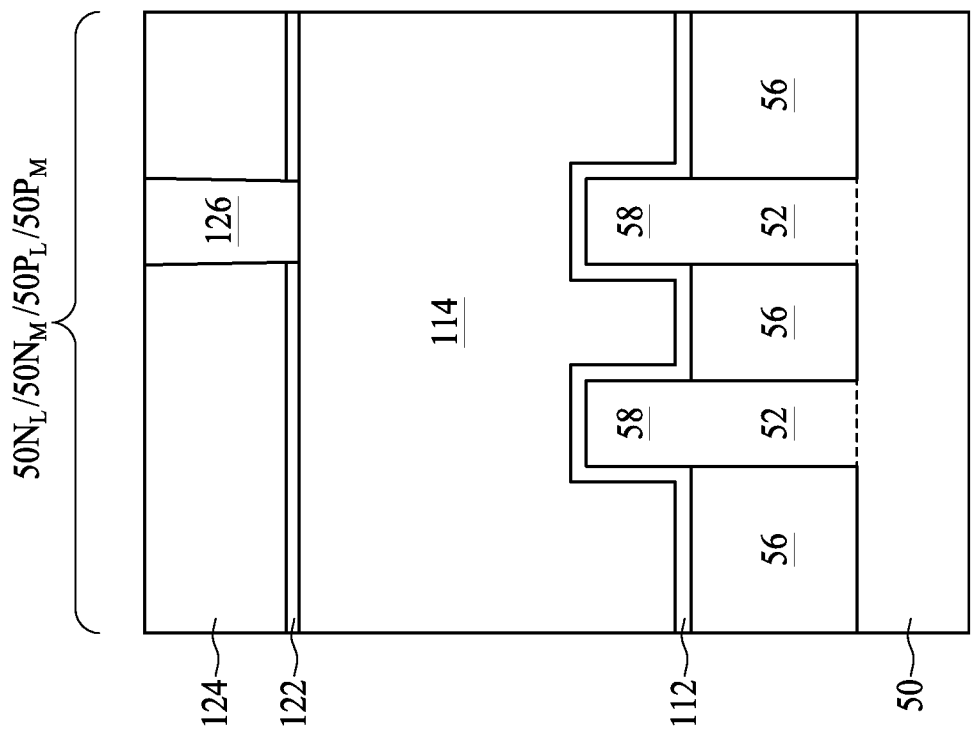
Figure 17A:
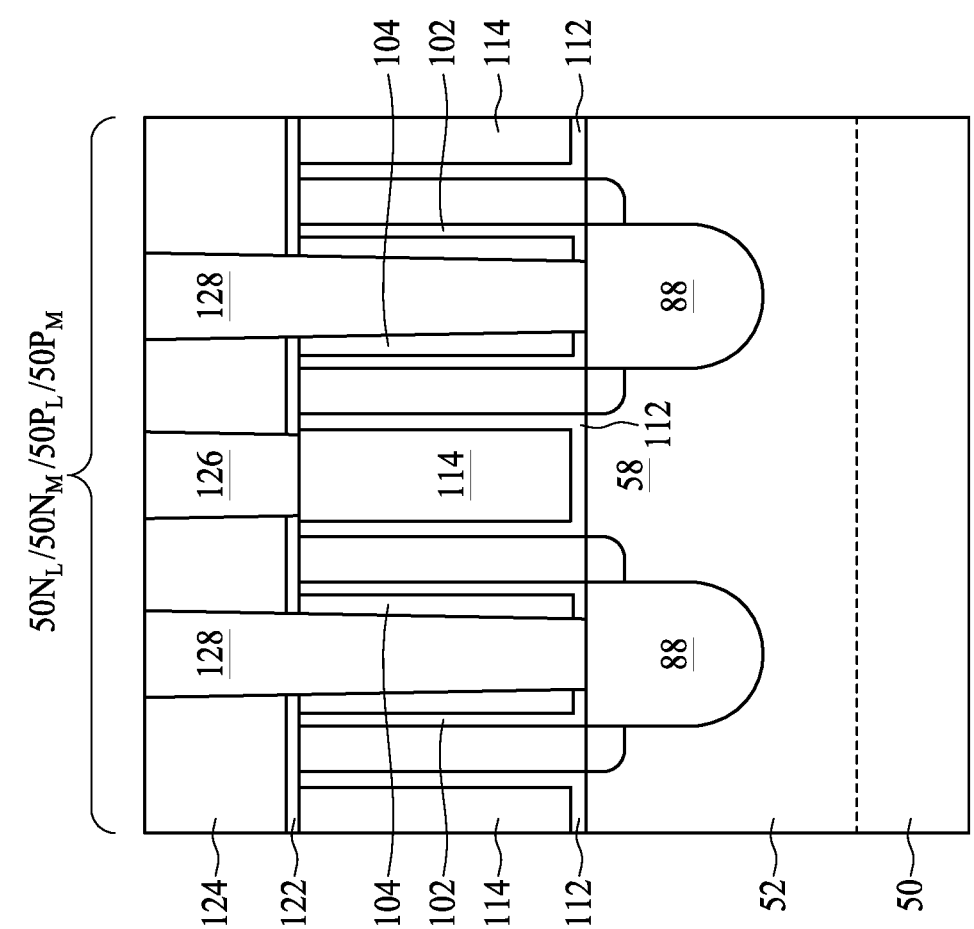

In FIGS. 17A and 17B, gate contacts 126 and source/drain contacts 128 are formed to contact, respectively, the gate electrodes 114 and the epitaxial source/drain regions 88. The gate contacts 126 are physically and electrically coupled to the gate electrodes 114, and the source/drain contacts 128 are physically and electrically coupled to the epitaxial source/drain regions 88.

As an example to form the gate contacts 126 and the source/drain contacts 128, openings for the gate contacts 126 are formed through the second ILD 124 and the ESL 122, and openings for the source/drain contacts 128 are formed through the second ILD 124, the ESL 122, the first ILD 104, and the CESL 102. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 124. The remaining liner and conductive material form the gate contacts 126 and the source/drain contacts 128 in the openings. An anneal process may be performed to form a silicide at the interface between the epitaxial source/drain regions 88 and the source/drain contacts 128. The gate contacts 126 and the source/drain contacts 128 may be formed in distinct processes, or may be formed in the same process. Although shown as being formed in the same cross-sections, it should be appreciated that each of the gate contacts 126 and the source/drain contacts 128 may be formed in different cross-sections, which may avoid shorting of the contacts.

Figure 18A:
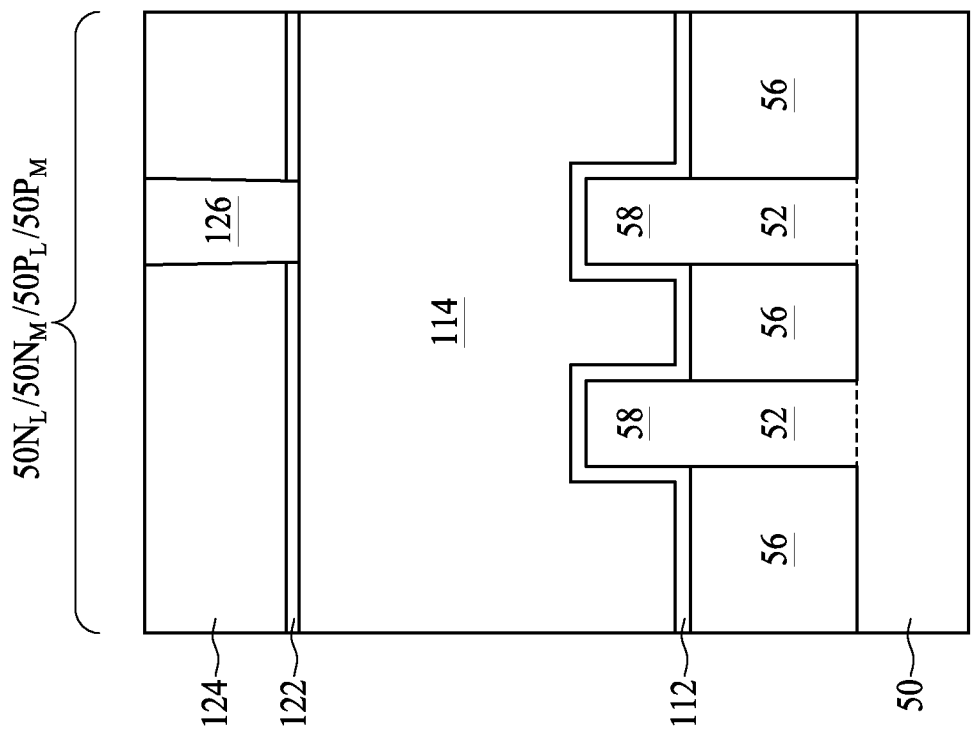
FIGS. 18A and 18B are various views of FinFETs, in accordance with some embodiments.
Figure 18B:
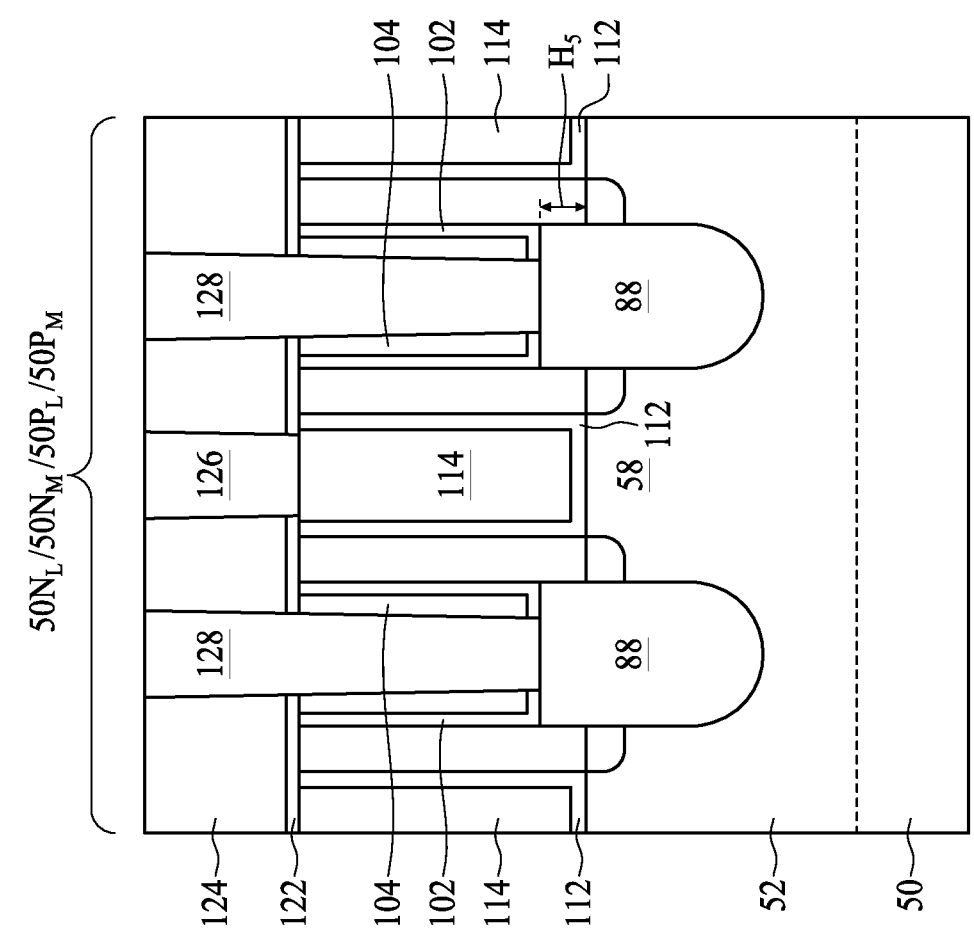
Figure 19B:
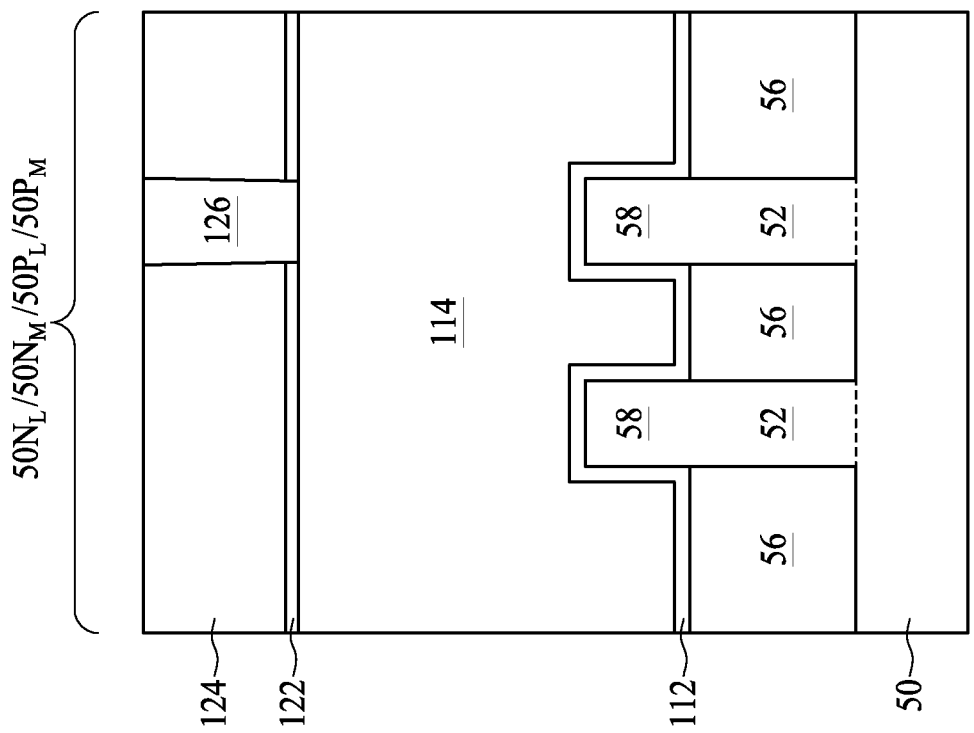
FIGS. 19A and 19B are various views of FinFETs, in accordance with some embodiments.
Figure 19A:
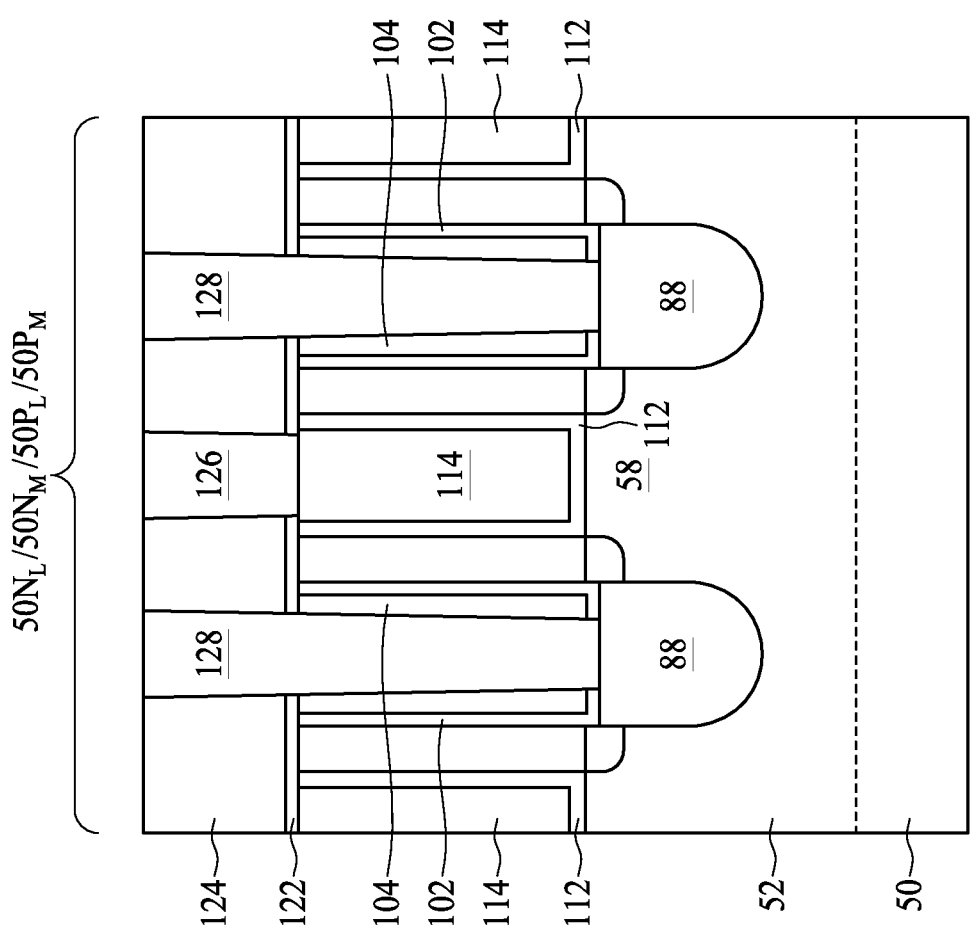

In the embodiment of FIGS. 2 through 13B, the top surfaces of the epitaxial source/drain regions 88 are coplanar with the top surfaces of the fins 52. In some embodiments, the top surfaces of the epitaxial source/drain regions 88 are raised above the top surfaces of the fins 52 (see FIGS. 18A and 18B). In some embodiments, the top surfaces of the epitaxial source/drain regions 88 are recessed below the top surfaces of the fins 52 (see FIGS. 19A and 19B). Whether (and to what extent) the top surfaces of the epitaxial source/drain regions 88 are raised above or recessed below the top surfaces of the fins 52 depends at least in part on the heights $H_1$-$H_4$ of the fin spacers 92 (discussed above for FIGS. 9A through 9D) and the depths $D_1$-$D_4$ of the source/drain recesses 94 (discussed above for FIGS. 9A through 9D). In some embodiments, the epitaxial source/drain regions 88 in the logic regions $50P_L$, $50N_L$ have top surfaces that are raised above the top surfaces of the fins 52, and the epitaxial source/drain regions 88 in the memory regions $50P_M$, $50N_M$ have top surfaces that are recessed below the top surfaces of the fins 52. The height $H_5$ that the top surfaces of the epitaxial source/drain regions 88 are raised above the top surfaces of the fins 52 by (also referred to as the "raised height") is greater for fin spacers 92 of greater heights, and thus the epitaxial source/drain regions 88 in the p-type logic regions $50P_L$ have a greater raised height than the epitaxial source/drain regions 88 in the n-type logic regions $50N_L$. For example, the ratio of the raised height of the epitaxial source/drain regions 88 in the p-type logic regions $50P_L$ to the raised height of the epitaxial source/drain regions 88 in the n-type logic regions $50N_L$ can be in the range of about 1.5 to about 2.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate structures and source/drain regions are formed in a manner similar to the above-described embodiments. After the dummy gate structures are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Embodiments may achieve advantages. Controlling the heights $H_1$-$H_4$ of the fin spacers 92 (discussed above for FIGS. 9A through 9D) and the depths $D_1$-$D_4$ of the source/drain recesses 94 (discussed above for FIGS. 9A through 9D) in the different regions allows the epitaxial source/drain regions 88 to have advantageous dimensions and shapes in the different regions. For example, the widths of the epitaxial source/drain regions 88 in the different regions may be controlled. Merging of the epitaxial source/drain regions 88 in the regions $50P_L$, $50N_L$, $50N_M$ may be promoted, while merging of the epitaxial source/drain regions 88 in the region $50P_M$ may be avoided. Further, differences in the epitaxial growth rates of different materials may be compensated for, so that the epitaxial source/drain regions 88 in the p-type logic region $50P_L$ and the n-type logic region $50N_L$ have similar volumes despite their different growth rates. Finally, the resulting shapes of the epitaxial source/drain regions 88 can allow for lower contact resistance. Controlling the heights $H_1$-$H_4$ of the fin spacers 92 and the depths $D_1$-$D_4$ of the source/drain recesses 94 to be in the ranges described herein allows the epitaxial source/drain regions 88 to have the advantageous dimensions and shapes described herein. When the heights $H_1$-$H_4$ of the fin spacers 92 or the depths $D_1$-$D_4$ of the source/drain recesses 94 are outside of the ranges described herein, the epitaxial source/drain regions 88 may not have the advantageous dimensions or shapes described herein.

In an embodiment, a device includes: first fins protruding from an isolation region; second fins protruding from the isolation region; a first fin spacer on a first sidewall of one of the first fins, the first fin spacer disposed on the isolation region, the first fin spacer having a first spacer height; a second fin spacer on a second sidewall of one of the second fins, the second fin spacer disposed on the isolation region, the second fin spacer having a second spacer height, the first spacer height greater than the second spacer height; a first epitaxial source/drain region on the first fin spacer and in the first fins, the first epitaxial source/drain region having a first width; and a second epitaxial source/drain region on the second fin spacer and in the second fins, the second epitaxial source/drain region having a second width, the first width greater than the second width. In some embodiments of the device, the first epitaxial source/drain region includes p-type dopants and the second epitaxial source/drain region includes n-type dopants. In some embodiments of the device, a ratio of the first spacer height to the second spacer height is in a range of 1 to 2. In some embodiments of the device, the first epitaxial source/drain region has a convex top surface and the second epitaxial source/drain region has a concave top surface. In some embodiments of the device, the convex top surface of the first epitaxial source/drain region is raised a first raised height above first top surfaces of the first fins, the concave top surface of the second epitaxial source/drain region is raised a second raised height above second top surfaces of the second fins, and the first raised height is greater than the second raised height. In some embodiments of the device, a ratio of the first raised height to the second raised height is in a range of 1.5 to 2.

In an embodiment, a device includes: a first fin extending from a substrate; a plurality of second fins extending from the substrate; a first epitaxial source/drain region in the first fin, the first epitaxial source/drain region having a first width; a second epitaxial source/drain region in the second fins, the second epitaxial source/drain region having a second width, the first width being less than the second width; first fin spacers on first sidewalls of the first epitaxial source/drain region and the first fin, the first fin spacers having a first spacer height; and second fin spacers on second sidewalls of the second epitaxial source/drain region and one of the second fins, the second fin spacers having a second spacer height, the first spacer height greater than the second spacer height. In some embodiments of the device, the first epitaxial source/drain region includes p-type dopants and the second epitaxial source/drain region includes n-type dopants. In some embodiments of the device, a ratio of the first width to the second width is in a range of 0.3 to 0.45. In some embodiments of the device, a ratio of the first spacer height to the second spacer height is in a range of 1 to 2. In some embodiments of the device, the first epitaxial source/drain region has a convex top surface and the second epitaxial source/drain region has a concave top surface.

In an embodiment, a method includes: forming a first fin and a second fin protruding from an isolation region; depositing a first dielectric layer on the first fin; depositing a second dielectric layer on the second fin; patterning the first dielectric layer to form first fin spacers adjacent the first fin and on the isolation region, the first fin spacers having a first spacer height; patterning the second dielectric layer to form second fin spacers adjacent the second fin and on the isolation region, the second fin spacers having a second spacer height, the first spacer height greater than the second spacer height; growing a first epitaxial source/drain region in the first fin and on the first fin spacers, the first epitaxial source/drain region having a first width; and growing a second epitaxial source/drain region in the second fin and on the second fin spacers, the second epitaxial source/drain region having a second width, the first width greater than the second width. In some embodiments of the method, the first fin is one of a plurality of first fins protruding from the isolation region, and the second fin is one of a plurality of second fins protruding from the isolation region, the first epitaxial source/drain region grown in each of the first fins, the second epitaxial source/drain region grown in each of the second fins. In some embodiments of the method, the first epitaxial source/drain region includes p-type dopants and the second epitaxial source/drain region includes n-type dopants. In some embodiments of the method, the patterning the first dielectric layer and the growing the first epitaxial source/drain region are performed while masking the second dielectric layer and the second fin, and the patterning the second dielectric layer and the growing the second epitaxial source/drain region are performed while masking the first dielectric layer and the first fin. In some embodiments of the method, the patterning the first dielectric layer and the growing the first epitaxial source/drain region are performed before the patterning the second dielectric layer and the growing the second epitaxial source/drain region. In some embodiments of the method, a ratio of the first spacer height to the second spacer height is in a range of 1 to 2. In some embodiments of the method, the first epitaxial source/drain region has a convex top surface and the second epitaxial source/drain region has a concave top surface. In some embodiments of the method, the convex top surface of the first epitaxial source/drain region is raised a first raised height above a first top surface of the first fin, the concave top surface of the second epitaxial source/drain region is raised a second raised height above a second top surface of the second fin, and the first raised height is greater than the second raised height. In some embodiments of the method, a ratio of the first raised height to the second raised height is in a range of 1.5 to 2.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first fin and a second fin protruding from an isolation region;
   depositing a first dielectric layer on the first fin;
   depositing a second dielectric layer on the second fin;
   patterning the first dielectric layer to form first fin spacers adjacent the first fin and on the isolation region, the first fin spacers having a first spacer height;
   patterning the second dielectric layer to form second fin spacers adjacent the second fin and on the isolation region, the second fin spacers having a second spacer height, the first spacer height being greater than the second spacer height;
   growing a first epitaxial source/drain region in the first fin and on the first fin spacers, the first epitaxial source/drain region having a first width, the first epitaxial source/drain region having a convex top surface;
   growing a second epitaxial source/drain region in the second fin and on the second fin spacers, the second epitaxial source/drain region having a second width, the first width being less than the second width, the second epitaxial source/drain region having a concave top surface; and
   depositing a dielectric material on the convex top surface of the first epitaxial source/drain region and on the concave top surface of the second epitaxial source/drain region.

2. The method of claim 1, wherein the first epitaxial source/drain region is grown in the first fin without merging, the second fin is one of a plurality of second fins protruding from the isolation region, and the second epitaxial source/drain region is grown in each of the second fins.

3. The method of claim 1, wherein the first epitaxial source/drain region comprises p-type dopants and the second epitaxial source/drain region comprises n-type dopants.

4. The method of claim 1, wherein the patterning the first dielectric layer and the growing the first epitaxial source/drain region are performed while masking the second dielectric layer and the second fin, and wherein the patterning the second dielectric layer and the growing the second epitaxial source/drain region are performed while masking the first dielectric layer and the first fin.

5. The method of claim 1, wherein the patterning the first dielectric layer and the growing the first epitaxial source/drain region are performed before the patterning the second dielectric layer and the growing the second epitaxial source/drain region.

6. The method of claim 1, wherein a ratio of the first spacer height to the second spacer height is in a range of 1 to 2.

7. The method of claim 1, wherein the convex top surface of the first epitaxial source/drain region is recessed below a first top surface of the first fin, and the concave top surface of the second epitaxial source/drain region is recessed below a second top surface of the second fin.

8. The method of claim 1 further comprising:
forming a first source/drain contact extending through the dielectric material, the first source/drain contact coupled to the first epitaxial source/drain region; and
forming a second source/drain contact extending through the dielectric material, the second source/drain contact coupled to the second epitaxial source/drain region.

9. A device comprising:
a first fin extending from a substrate;
a second fin extending from the substrate;
a first fin spacer on a first sidewall of the first fin, the first fin spacer having a first spacer height;
a second fin spacer on a second sidewall of the second fin, the second fin spacer having a second spacer height, the first spacer height being greater than the second spacer height;
a first epitaxial source/drain region on the first fin spacer and in the first fin, the first epitaxial source/drain region having a first width, the first epitaxial source/drain region having a convex top surface; and
a second epitaxial source/drain region on the second fin spacer and in the second fin, the second epitaxial source/drain region having a second width, the first width being greater than the second width, the second epitaxial source/drain region having a concave top surface, the first epitaxial source/drain region having a same number of semiconductor material layers as the second epitaxial source/drain region.

10. The device of claim 9, wherein the convex top surface of the first epitaxial source/drain region is raised a first raised height above a first top surface of the first fin, the concave top surface of the second epitaxial source/drain region is raised a second raised height above a second top surface of the second fin, and the first raised height is greater than the second raised height.

11. The device of claim 10, wherein a ratio of the first raised height to the second raised height is in a range of 1.5 to 2.

12. The device of claim 9 further comprising:
a third fin extending from the substrate;
a fourth fin extending from the substrate;
a third fin spacer on a third sidewall of the third fin, the third fin spacer having a third spacer height;
a fourth fin spacer on a fourth sidewall of the fourth fin, the fourth fin spacer having a fourth spacer height, the third spacer height being greater than the fourth spacer height;
a third epitaxial source/drain region on the third fin spacer and in the third fin, the third epitaxial source/drain region having a third width, the third epitaxial source/drain region having a convex top surface; and
a fourth epitaxial source/drain region on the fourth fin spacer and in the fourth fin, the fourth epitaxial source/drain region having a fourth width, the fourth width being greater than the third width, the fourth epitaxial source/drain region having a concave top surface, the third epitaxial source/drain region having a same number of semiconductor material layers as the fourth epitaxial source/drain region.

13. The device of claim 12, wherein the fourth spacer height is greater than the first spacer height.

14. The device of claim 9, wherein the first epitaxial source/drain region comprises p-type dopants and the second epitaxial source/drain region comprises n-type dopants.

15. A device comprising:
a first fin extending from a substrate;
a second fin extending from the substrate;
a first epitaxial source/drain region in the first fin, the first epitaxial source/drain region having a first width, the first epitaxial source/drain region having a convex top surface, the convex top surface raised above a first top surface of the first fin;
a second epitaxial source/drain region in the second fin, the second epitaxial source/drain region having a second width, the first width being greater than the second width, the second epitaxial source/drain region having a concave top surface, the concave top surface raised above a second top surface of the second fin;
first fin spacers on first sidewalls of the first epitaxial source/drain region and the first fin, the first fin spacers having a first spacer height; and
second fin spacers on second sidewalls of the second epitaxial source/drain region and the second fin, the second fin spacers having a second spacer height, the first spacer height being greater than the second spacer height.

16. The device of claim 15, wherein the convex top surface of the first epitaxial source/drain region is raised a first raised height above the first top surface of the first fin, the concave top surface of the second epitaxial source/drain region is raised a second raised height above the second top surface of the second fin, and the first raised height is greater than the second raised height.

17. The device of claim 15 further comprising:
a third fin extending from the substrate;
a fourth fin extending from the substrate;
a third epitaxial source/drain region in the third fin, the third epitaxial source/drain region having a third width, the third epitaxial source/drain region having a convex top surface;
a fourth epitaxial source/drain region in the fourth fin, the fourth epitaxial source/drain region having a fourth width, the fourth width being greater than the third width, the fourth epitaxial source/drain region having a concave top surface;
third fin spacers on third sidewalls of the third epitaxial source/drain region and the third fin, the third fin spacers having a third spacer height; and
fourth fin spacers on fourth sidewalls of the fourth epitaxial source/drain region and the fourth fin, the fourth fin spacers having a fourth spacer height, the third spacer height being greater than the fourth spacer height.

18. The device of claim 17, wherein the fourth spacer height is greater than the first spacer height.

19. The device of claim 15, wherein the first epitaxial source/drain region comprises p-type dopants and the second epitaxial source/drain region comprises n-type dopants.

20. The device of claim 15, wherein the first fin spacers comprise inner fin spacers and outer fin spacers, the inner fin spacers and the outer fin spacers having different heights.

* * * * *